(12) United States Patent
Kim et al.

(10) Patent No.: US 8,821,758 B2
(45) Date of Patent: Sep. 2, 2014

(54) COMPLEX CRYSTAL PHOSPHOR, LIGHT EMITTING DEVICE, SURFACE LIGHT SOURCE APPARATUS, DISPLAY APPARATUS, AND LIGHTING DEVICE

(75) Inventors: Do Hwan Kim, Gwangju (KR); Jeong Ho Ryu, Gyunggi-do (KR); Sang Hyun Kim, Seoul (KR); Chul Soo Yoon, Gyunggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 566 days.

(21) Appl. No.: 13/071,201

(22) Filed: Mar. 24, 2011

(65) Prior Publication Data

US 2011/0234118 A1    Sep. 29, 2011

(30) Foreign Application Priority Data

Mar. 26, 2010    (KR) .................. 10-2010-0027313

(51) Int. Cl.
    C09K 11/08    (2006.01)
    C09K 11/66    (2006.01)
(52) U.S. Cl.
    USPC ................................. 252/301.4 F
(58) Field of Classification Search
    USPC ................... 252/301.4 F, 301.4 R
    See application file for complete search history.

(56) References Cited

U.S. PATENT DOCUMENTS

| | | |
|---|---|---|
| 2006/0033081 A1 | 2/2006 | Hintzen et al. |
| 2006/0232193 A1 | 10/2006 | Fiedler et al. |
| 2007/0075629 A1 | 4/2007 | Le Toquin et al. |
| 2007/0166218 A1 | 7/2007 | Hirosaki et al. |
| 2008/0054793 A1 | 3/2008 | Yang et al. |
| 2008/0081011 A1 | 4/2008 | Oshio |
| 2010/0038590 A1 | 2/2010 | Suzuki et al. |
| 2010/0053932 A1 | 3/2010 | Emoto et al. |
| 2010/0200874 A1 | 8/2010 | Shioi et al. |
| 2011/0096560 A1* | 4/2011 | Ryu et al. ............. 362/510 |

FOREIGN PATENT DOCUMENTS

| | | |
|---|---|---|
| DE | 102007025679 | 12/2008 |
| JP | 2005-255895 | 9/2005 |
| JP | 2006-206729 | 8/2006 |
| WO | WO 02/054202 | 7/2002 |
| WO | WO 02/054203 | 7/2002 |

OTHER PUBLICATIONS

Office Action for Chinese Application No. 201010534002.0, dated Dec. 21, 2012 (corresponds to U.S. Appl. No. 12/910,514).
European Search Report EP11159690, Jul. 5, 2012.
U.S. Appl. No. 12/910,514, Dec. 31, 2012 Non-Final Office Action.

(Continued)

*Primary Examiner* — Carol M Koslow
*Assistant Examiner* — Lynne Edmondson
(74) *Attorney, Agent, or Firm* — McDermott Will & Emery LLP

(57) ABSTRACT

A complex crystal phosphor is an inorganic composition containing at least an M element, an Al element, silicon, oxygen, and nitrogen. The inorganic composition has particles having at least two types of crystal phase, and the at least two types of crystal phase include a first crystal phase which is the same as a $M_2SiO_4$ crystal and a second crystal phase as a β-sialon crystal. Here, M is at least one element selected from the group consisting of (Mg), calcium (Ca), strontium (Sr), and barium (Ba).

13 Claims, 14 Drawing Sheets

(56) References Cited

OTHER PUBLICATIONS

Sohn, et al., "Luminescence and Energy transfer of $Mn^{2+}$ Co-Doped $SrSi_2O_2N_2$: $Eu^{2+}$ Green-Emitting Phosphorus", *Material Science and Engineering B*, 164:12-15 (2009).

Sohn, et al., "Luminescence of $Sr_2SiO_{4-x}N_{2x/3}$:$Eu^{2+}$ Phosphorus Prepared by Spark Plasma Sintering", *Journal of the Electromechanical Society*, 155(2):J58-J61 (2007).

Yun, et al., "Luminescence Properties of $(Sr_{1-u}Ba_u)Si_2O_2N_2$:$Eu^{2+}$ Yellow or Orange Phosphorus for white LEDs, Synthesized with $(Sr_{1-u}Ba_u)_2SiO_4$: Eu2+ as a Precursor", *Journal of the Electromechanical Society*, 154(10):J320-J325 (2007).

Zhang, et al., "A Tunable Green Alkaline-Earth Silicon-Oxynitride Solid Solution $(Ca_{1-x}Sr_x)Si_2O_2N_2$: $Eu^{2+}$ and its Application in LED", *Appl. Phys. B.*, 93:829-835 (2008).

Extended European Search Report for EP10188129.0, dated Dec. 27, 2010.

* cited by examiner

COMPLEX CRYSTAL PHOSPHOR, LIGHT EMITTING DEVICE, SURFACE LIGHT SOURCE APPARATUS, DISPLAY APPARATUS, AND LIGHTING DEVICE

CROSS-REFERENCE TO RELATED APPLICATIONS

This application claims the priority of Korean Patent Application No. 2010-27313 filed on Mar. 26, 2010, in the Korean Intellectual Property Office, the disclosure of which is incorporated herein by reference.

BACKGROUND OF THE INVENTION

1. Field of the Invention

The present invention relates to phosphor and, more particularly, to a complex crystal phosphor having high level light emission characteristics, excellent thermal and chemical stability, a light emitting device using the same, a surface light source apparatus, a display apparatus, and a lighting device.

2. Description of the Related Art

In general, a wavelength conversion phosphor material is used to convert a particular wavelength of light from various light sources into a desired wavelength of light. In particular, a light emitting diode (LED), among various light sources, is able to be driven with low power consumption and has excellent light efficiency so it may be advantageously applied to an LED backlight, a vehicle lighting system, and a home lighting system. Recently, a phosphor material has been recognized as a core technology in the manufacturing of a white light emitting device.

In general, a white light emitting device is manufacturing by applying one or more types of phosphors (e.g., yellow, red, and blue phosphors) to a blue or an ultraviolet LED chip. In particular, in case in which a red phosphor and one or more of other phosphors are combined to be used, if a half amplitude of each of the phosphors is low, a sufficient color rendering index (or a sufficient color rendition index number) cannot be secured and there is a limitation in implementing desired natural white light. The requirement of color rendering may be a critical evaluation item in employing the white light emitting device as a light source for illumination.

In particular, the half amplitude of a conventional red phosphor is a relatively low, making it difficult to implement sufficient overall color rendering. Thus, a red phosphor used in a white light emitting device is required to have a high half amplitude while maintaining high luminous efficiency.

Meanwhile, a red phosphor, such as a silicate-based phosphor, has a relatively low thermal stability as compared with other phosphors, so it is not suitable as a wavelength conversion material of an LED device used in high temperature conditions.

SUMMARY OF THE INVENTION

An aspect of the present invention provides a complex crystal phosphor emitting red light having excellent thermal and chemical stability and guaranteeing high color rendering.

Another aspect of the present invention provides a light emitting device package, a surface light source apparatus, and a lighting device capable of emitting white light having excellent color rendering close to that of natural light by employing the foregoing complex crystal phosphor as a red phosphor.

According to an aspect of the present invention, there is provided a complex crystal phosphor which is an inorganic composition containing at least an M element, an Al element, silicon, oxygen, and nitrogen, wherein the inorganic composition has particles having at least two types of crystal phase, and the at least two types of crystal phase include a first crystal phase of a $M_2SiNO_{4-y}N_x$ ($0<x<3$, $y=2x/3$) crystal and a second crystal phase of a β-sialon crystal, wherein M is at least one element selected from the group consisting of (Mg), calcium (Ca), strontium (Sr), and barium (Ba).

When an excitation source is irradiated, the complex crystal phosphor, as a red phosphor, may emit light having a peak wavelength ranging from 570 nm to 660 nm. Even if the complex crystal phosphor is configured as complex crystals having various crystals, it may have a single peak wavelength within a light emission spectrum.

The excitation source may have a peak wavelength ranging from 300 nm to 480 nm.

In order to guarantee an excellent color rendering index when applied to a white light emitting device, the complex crystal phosphor may have a light emission wavelength spectrum having a half amplitude of approximately 100 nm.

The first crystal phase may be $Sr_2SiO_{4-x}N_y$ ($0<x<3$, $y=2x/3$). The second crystal phase may be $Si_{6-z}Al_zO_zN_{8-z}$ ($0<z<1$). Preferably, the first crystal phase may be contained at 60 to 95 mass percent, and the second crystal phase may be contained at 5 to 40 mass percent.

The complex crystal phosphor may further include a different crystal phase, e.g., a third crystal phase as a $M_{2-a}Si_5O_{8-a}N_b$ ($0<a<8$, $b=2a/3$) crystal. In this case, the first crystal phase may be contained at 50 to 90 mass percent, the second crystal phase may be contained at 5 to 40 mass percent, and the third crystal phase may be contained at 10 mass percent or less.

The phosphor may further include at least one type of rare earth element as an activator, and the rare earth element (Re) may be selected from the group consisting of cerium (Ce), praseodymium (Pr), neodymium (Nd), samarium (Sm), europium (Eu), gadolinium (Gd), terbium (Tb), dysprosium (Dy), Holmium (Ho), erbium (Er), thulium (Tm), and ytterbium (Yb).

According to an aspect of the present invention, there is provided a white light emitting device including: an LED chip emitting excitation light; a red phosphor disposed around the LED chip to wavelength-convert at least a portion of the excitation light and including the foregoing complex crystal phosphor; and at least one light emitting element providing light of a wavelength different from a light emission wavelength of the LED chip and a light emission wavelength of the red phosphor, wherein the at least one light emitting element may be at least one of an additional LED chip and a different type of phosphor.

The LED chip may be an LED chip emitting ultraviolet light, the LED chip may be a blue LED chip having a peak wavelength ranging from 430 nm to 470 nm, and the at least one light emitting element may include a green phosphor.

The light emission wavelength peak of the green phosphor may range from 500 nm to 550 nm. The blue LED chip may have a half amplitude ranging from 10 nm to 50 nm, the green phosphor may have a half amplitude ranging from 30 nm to 200 nm, and the red phosphor may have a half amplitude ranging from 100 nm to 250 nm.

The green phosphor may include at least one of an oxynitride phosphor expressed by an empirical formula $M_xA_yO_xN_{(4/3)y}$, an oxynitride phosphor expressed by $M_aA_b$-$O_cN_{(2/3)a+(4/3)b-(2/3)c}$, and a β-sialon phosphor expressed by $Si_{6-z}Al_zO_zN_{8-z}$. Here, M is at least one type of a group II element selected from the group consisting of beryllium (Be), magnesium (Mg), calcium (Ca), strontium (Sr), and zinc (Zn), and A is at least one type of a group IV element selected from the group consisting of carbon (C), silicon (Si), germanium (Ge), tin (Sn), titanium (Ti), zirconium (Zr), and hafnium (Hf).

The at least one light emitting element may further include a yellow or yellowish-orange phosphor. The yellow phosphor may be a silicate-based phosphor, and the yellowish-orange phosphor may be an $\alpha$-SiAlON:Re phosphor.

In a different exemplary embodiment, the at least one light emitting element may be provided as a green LED chip, rather than as a wavelength conversion material such as a phosphor.

The LED chip may have a structure in which first and second electrodes face the same surface. Alternatively, the LED chip may have a structure in which the first and second electrodes face different opposing surfaces.

In a different exemplary embodiment, the LED chip may include: a semiconductor stacked body having first and second conductive semiconductor layers providing first and second main surfaces opposed to each other and an active layer formed between the first and second conductive semiconductor layers, a contact hole connected to one area of the first conductive semiconductor layer from the second main surface through the active layer, a first electrode formed on the second main surface of the semiconductor stacked body and connected to one area of the first conductive semiconductor layer through the contact hole, and a second electrode formed on the second conductive semiconductor layer formed on the second main surface of the semiconductor stacked body.

In this case, any one of the first and second electrodes may be drawn out laterally from the semiconductor stacked body.

The white light emitting device may further include a package main body having a recess in which the LED chip is mounted.

The white light emitting device may further include a resin packaging part encapsulating the LED chip, and at least one of the plurality of phosphors may be dispersed in the resin packaging part.

The white light emitting device may have a structure in which resin layers including a plurality of phosphors are stacked.

A color rendering index (CRI) of white light emitted from the white light emitting device may be 70 or higher.

According to another aspect of the present invention, a phosphor having an enhanced half amplitude of its light emission peak where the half amplitude is enhanced by introducing multiple phosphor crystal phases to the phosphor.

The present invention provides a method for enhancing the half amplitude of a light emission peak of a phosphor by introducing multiple phosphor crystal phases to the phosphor. In particular, the multiple crystal phases are employed in a way that the resulting phosphor contains a quasi-orthorhombic crystal.

The present invention provides a method for creating a light emission peak by steps including applying electricity to a light emitting device and allowing the light emitted from the light emitting device pass through a phosphor containing a complex crystal phosphor having two or more crystal phases.

The present invention can provide a surface light source apparatus using the foregoing complex crystal phosphor as a wavelength conversion material, a display apparatus, and a lighting device.

BRIEF DESCRIPTION OF TEE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
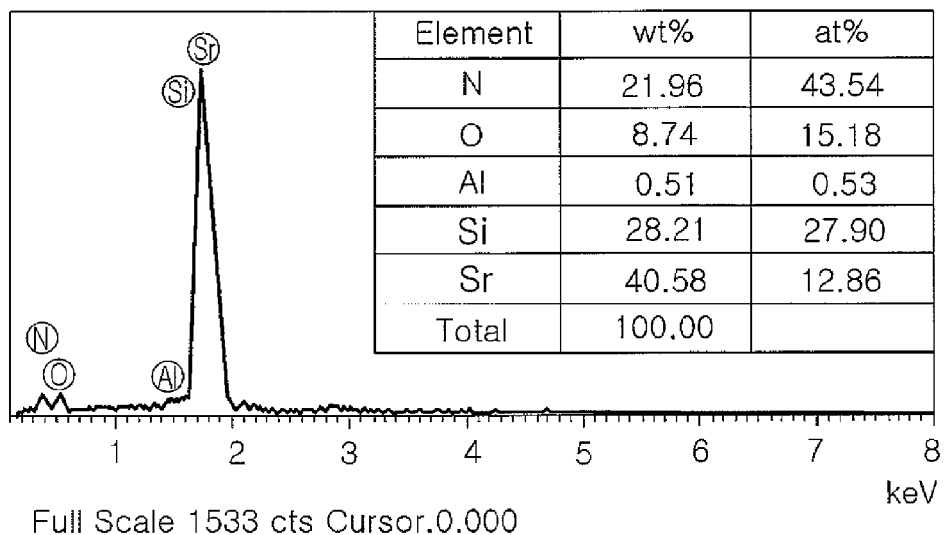
FIGS. 1 and 2 illustrate EDAX data analysis results with respect to the complex crystal phosphor particle prepared according to an exemplary embodiment of the present invention.

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

The present invention provides a novel complex crystal phosphor. The term "complex crystal phosphor" used in the present disclosure refers to a phosphor including phosphor particles having two or more different crystal phases.

The complex crystal phosphor is an inorganic composition including at least an M element, an Al element, silicon, oxygen, and nitrogen, and the inorganic composition includes particles having at least two types of crystal phase.

The at least two types of crystal phase include a first crystal phase which is the same as a crystal of $M_2SiO_{4-x}N_y$ ($0<x<3$, $y=2x/3$) and a second crystal phase which is the same as a crystal of $Si_{6-z}Al_zO_zN_{8-z}$ ($0<z<1$). Here, M may be at least one element selected from the group consisting of magnesium (Mg), calcium (Ca), strontium (Sr), and barium (Ba).

The first crystal phase may be $Sr_2SiO_{4-x}N_y$ ($0<x<3$, $y=2x/3$), which is a red phosphor, and may have improved thermal or chemical stability by substituting a portion of oxygen with nitrogen.

The first crystal phase may constitute a primary part of the complex crystal phosphor, and a half amplitude of an emission spectrum can be extended by the additional second crystal phase to guarantee high color rendering in a white light emitting device.

An excitation source may include the visible spectrum as well as an ultraviolet (UV) band, and preferably, it may be a peak wavelength ranging from 300 nm to 480 nm. The excitation source may be irradiated to emit light having a peak wavelength ranging from 570 nm to 660 nm.

In particular, β-sialon, the second crystal phase, is a red phosphor, which may be partially synthesized as a crystal phase of the complex crystal phosphor to extend the half amplitude (ranging from 70 nm to 80 nm) of the first crystal phase.

The complex crystal configured to include both the β-sialon crystal phase and a different crystal phase can provide an emission spectrum having a great half amplitude (approximately 100 nm or larger) while having a substantially single peak wavelength.

Preferably, the first crystal phase for the red emission may be contained at 60 to 95 mass percent, and the second crystal phase for improving color rendering may be contained at 5 to 40 mass percent. If a β-sialon crystal phase, the second crystal phase, is contained at less than 5 mass percent of the total weight, the effect of improvement of color rendering according to the half amplitude improvement is not sufficient, and If β-sialon crystal phase is contained at more than 40 mass percent of the total weight, the conversion efficiency is lowered to reduce the overall light amount.

The phosphor may be an inorganic composition including at least one rare earth element. The rare earth element (Re) may be selected from the group consisting of cerium (Ce), praseodymium (Pr), neodymium (Nd), samarium (Sm), europium (Eu), gadolinium (Gd), terbium (Tb), dysprosium (Dy), Holmium (Ho), erbium (Er), thulium (Tm), and ytterbium (Yb). In particular, the conversion efficiency can be improved by adding dysprosium (Dy) along with europium (Eu) as activators (e.g., by approximately 5 to 10 percent). Thus, the efficiency, which is slightly lowered according to the improvement of the half amplitude, can be supplemented (or offset).

A method for manufacturing the foregoing complex crystal phosphor will now be described. An M-containing compound (Here, M is at least one among magnesium (Mg), calcium (Ca), strontium (Sr), and barium (Ba)), an Si-containing oxide, an Si-containing nitride, and Al-containing compound are weighed according to a desired stoichiometry and prepared as raw materials to be mixed. In addition, a rare earth element (Re)-containing compound, such as an Eu-containing compound, may be further included.

In a particular exemplary embodiment, the complex crystal phosphor may further include a third crystal phase as a crystal of $M_2Si_5O_aN_{8-b}$ ($0<a<3$, $b=2a/3$). In this case, the first crystal phase may be contained at 50 to 90 mass percent, the second crystal phase may be contained at 5 to 40 mass percent, and the third crystal phase may be contained at 10 mass percent or less.

The weighed raw materials may be mixed by using one of dry mixing and wet mixing methods.

First, according to the wet mixing method, the weighed mixture, a ball assisting in the mixing and crushing process of the raw materials, and a solvent are inserted to a container and then mixed. In this case, as the ball, a ball made of a material such as silicon oxide ($Si_3N_4$) or zirconia ($ZrO_2$), or a ball generally used for mixing raw materials may be used. As the solvent, distilled water (D.I. water), an alcohol such as ethanol, or the like, an organic solvent such as hexane, or the like, may be all used. Namely, the raw materials, the solvent, and the ball may be put in the container, the container hermetically sealed, and the raw materials homogeneously mixed by using a device, such as a miller, or the like, for 1 to 28 hours. After the mixing process is completed, the mixed raw materials and ball are separated and the solvent contained therein may be mostly dried in an oven for 1 to 48 hours. After the drying process is completed, the obtained powder may be evenly classified by using a sieve made of a metal or a polymer under the conditions of a desired micrometer size.

Meanwhile, according to the dry mixing method, raw materials are inserted into a container without using a solvent and are then homogeneously mixed by using a milling machine. A mixing duration is approximately 1 to 24 hours, and in this case, a ball may be inserted together with the raw materials to facilitate the mixing operation to thus shorten the mixing duration. The dry mixing method is advantageous in that it can reduce the overall processing time because it does not require a solvent drying process, compared with the wet mixing method. When the mixing of the raw materials is completed, like the wet mixing method, the obtained powder may be evenly classified by using a sieve made of a metal or a polymer under the condition of a desired micrometer size.

The classified mixture powder may be put in a boron nitride (BN) crucible (or melting pot) and a firing process may be performed thereon. In this case, the firing process is performed at a desired firing temperature (e.g., 1850 to 2300° C., 1000 to 1800° C.) for 1 to 24 hours by using a heating furnace. The firing process may be performed under the atmosphere of 100% nitrogen ($N_2$) or a mixed nitrogen gas containing 1 to 10% of hydrogen. The synthesized phosphor powder may be homogeneously crushed by using a mortar or a crusher (or a mill, grinder, etc.) and a post-thermal process may be repeatedly performed one to three times to improve the luminance of the phosphor.

The complex crystal phosphor obtained through the process may include two types of crystal phases. Namely, a red phosphor as a complex crystal phosphor including $M_2SiO_{4-x}N_y$ as a main ingredient and the inorganic compound, β-SiAlON, may be prepared. Here, M is at least one selected from the group consisting of magnesium (Mg), calcium (Ca), strontium (Sr), and barium (Ba), which meets the conditions of $0<x<3$, $y=2x/3$. In another example, M may be partially substituted with at least one different monovalent or bivalent element.

Finally, the fired phosphor powder is crushed through the mortar or the crusher and its grain size is controlled through a classifying process to implement an optimum grain size. Then, typically, a complex crystal phosphor including particles having a homogeneous size of 16 micrometers or smaller can be obtained by using a sieve having a size of 16 micrometers.

The phosphor powder obtained thusly may be post-processed by using distilled water (D.I. Water), an inorganic acid, an organic acid, or a base to remove impurities such as an extra glass phase, a non-reacted metal material, or the like, contained in the phosphor. For example, nitric acid having a concentration of 0.1 to 60% may be added to the phosphor powder, and the resultant phosphor powder may be then stirred for 1 to 10 hours to elute the extra impurities to remove the same.

Besides the nitric acid, sulfuric acid, hydrochloric acid, fluoric acid, or a mixed solution of these inorganic acids may be used as the inorganic acid. Meanwhile, impurities, which may not yet have been removed through the acidification (or acid treatment), may be removed by using a base. An inorganic base, such as sodium hydroxide, potassium hydroxide, or the like, or a mixed solution of these inorganic bases, may be used as the base.

As for a phosphor slurry remaining after the acidification or the salt treatment, a remaining acid or salt may be cleansed by using D.I. water, and the phosphor powder is wet-classified, filtered, and then dried to finally obtain desired phosphor powder. The drying process may be performed for a sufficient period of time at 50 to 150° C.

In a particular exemplary embodiment, a Sr-containing compound may be used as the M-containing compound, and in this case, the Sr-containing compound may be $SrCO_3$. The Eu-containing compound may be europium oxide ($Eu_2O_3$). The Si-containing oxide may be silicon oxide ($SiO_2$). The Si-containing nitride may be silicon nitride ($\alpha$-$Si_3N_4$ and $\beta$-$Si_3N_4$). The Al-containing compound may be aluminum oxide ($Al_2O_3$) or aluminum nitride (AlN).

The present invention will now be described in more detail through various exemplary embodiments, but the technical concept of the present invention is not intended to be limited thereto.

[Embodiment 1]

$SiO_2$, $Si_3N_4$, $Al_2O_3$, $Eu_2O_3$, and $SrCO_3$ were weighed in the following amounts to prepare raw materials, and the raw materials were mixed with an ethanol solvent by using a ball mill.

$SrCO_3$: 1.259 g
$SiO_2$: 1.585 g
$Si_3N_4$: 1.134 g
$Al_2O_3$: 1.345 g
$Eu_2O_3$: 0.083 g

The ethanol solvent in the raw mixture was volatilized by using a dryer, the dried raw mixture was put in a crucible, and the crucible filled with the raw mixture was inserted into a heating furnace and fired at 1,950° C. for 8 hours in a gaseous state under N2 atmosphere.

The fired phosphor was crushed and then subjected to a post-thermal treating process and a pickling process to obtain a complex crystal phosphor.

Figure 2:
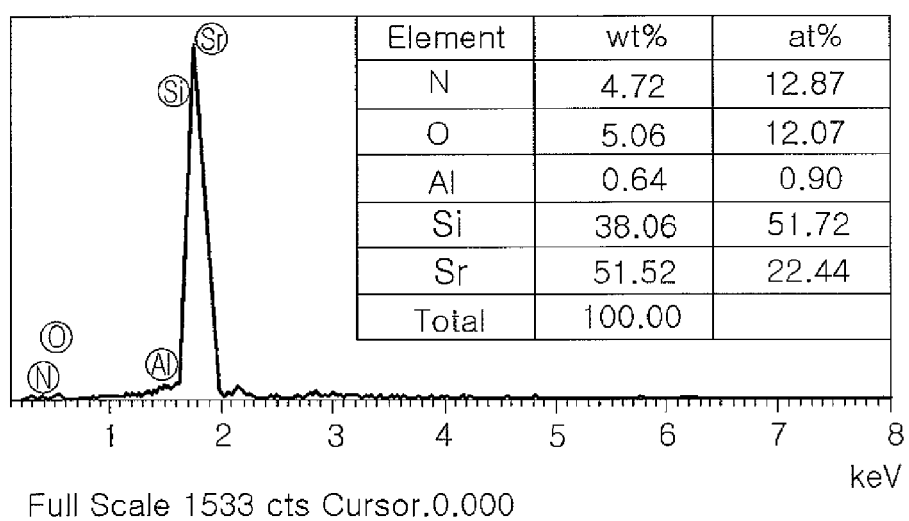

EDAX results obtained by analyzing the particle shape of the synthesized complex crystal phosphor and the components of respective phosphor particles constituting the complex crystal phosphor are shown in FIGS. 1 and 2.

With reference to FIGS. 1 and 2, the results of analyzing elements obtained by measuring the particles at different positions.

As a result, an aluminum (Al) component, as well as strontium (Sr), silicon (Si), oxygen (O), and nitrogen (N), was also checked. Namely, it was confirmed that aluminum (AL) constitutes the crystal along with the crystals of the other elements in the phosphor particles.

Figure 3:
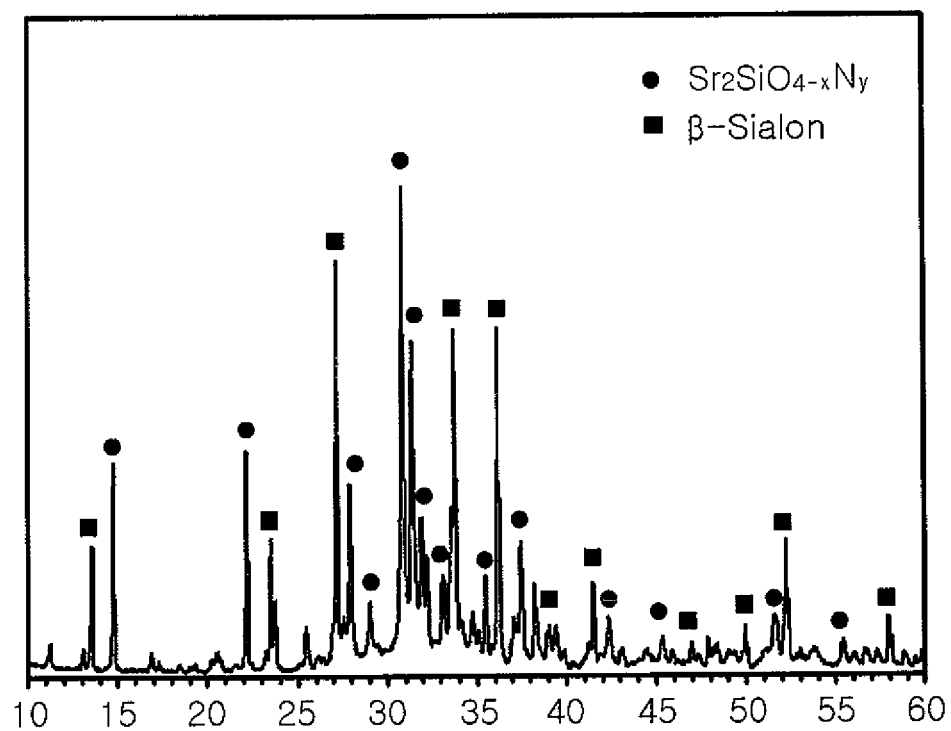
FIG. 3 is an XRD graph of the complex crystal phosphor prepared according to an exemplary embodiment of the present invention.

The crystal structure of the complex crystal phosphor synthesized in Embodiment 1 was checked through an XRD analysis. FIG. 3 shows an XRD analysis graph of the complex crystal phosphor according to Embodiment 1.

As shown in FIG. 3, it can be confirmed that the complex crystal phosphor has two crystal phases each having a peak corresponding to an $Sr_2SiO_4$ crystal and a peak corresponding to a β-sialon crystal containing aluminum (Al).

A first crystal indicating the $Sr_2SiO_4$ crystal peak was analyzed to be $Sr_2SiO_{2.4}N_{1.6}$ and a second crystal indicating the β-sialon crystal peak containing aluminum (Al) was analyzed to be $Si_{5.4}Al_{0.6}O_{0.6}N_{7.4}$. Thus, it was confirmed that the complex crystal phosphor prepared according to Embodiment 1 was a quasi-orthorhombic crystal in which the foregoing two crystal phases are mutually employed.

In addition, a cathodoluminescence (CL) analysis was performed on the complex crystal phosphor prepared according to Embodiment 1.

The results showed that the complex crystal phosphor synthesized according to the present embodiment exhibits a red image and has a red spectrum in the vicinity of 618 nm.

Comparative Example 1

In order to prepare a phosphor having a $Sr_2SiO_4$ crystal without a β-sialon, the same raw materials as those of Embodiment 1, excluding the raw material of aluminum Al, were mixed at a proper rate and mixed, and the same process was performed.

Namely, the raw materials $SiO_2$, $Si_3N_4$, $Eu_2O_3$, and $SrCO_3$ were weighed as follows to prepare raw materials, and the raw materials were mixed with an ethanol solvent by using a ball mill.

$SrCO_3$: 1.529 g
$SiO_2$: 1.657 g
$Si_3N_4$: 1.284 g
$Eu_2O_3$: 0.083 g

The ethanol solvent in the row mixture was volatilized by using a dryer and the dried raw mixture was put in a crucible, and the crucible filled with the raw mixture was inserted in a heating furnace and then fired at 1,950° C. for 8 hours in a gaseous state under an $N_2$ atmosphere.

The fired phosphor was crushed and then subjected to a post-thermal treatment process and a pickling process to obtain a composite crystal phosphor.

Figure 4:
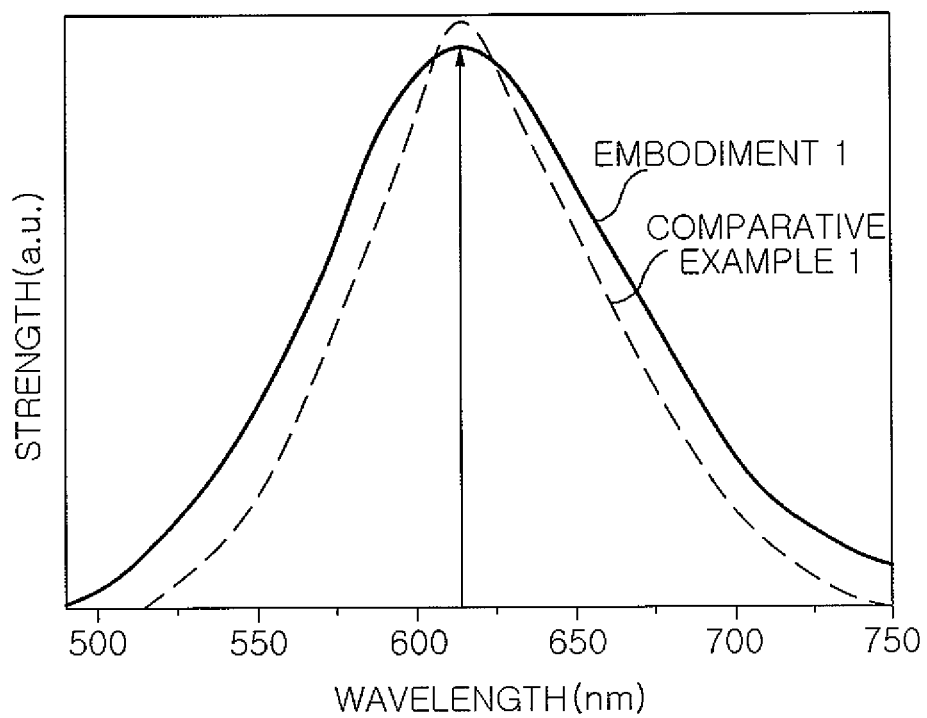
FIG. 4 is a graph comparatively showing an emission spectrum of the complex crystal phosphor according to Embodiment 1 of the present invention and that of Comparative Example 1.

FIG. 4 is a graph comparatively showing an emission spectrum of the complex crystal phosphor according to embodiment 1 of the present invention and that of Comparative Example 1.

As shown in FIG. 4, the complex crystal phosphor having the same oxynitride crystal as that of the first crystal phase phosphor according to Comparative Example 1, namely, $Sr_2SiO_4$, has a peak wavelength of 615 nm to 620 nm and has a half amplitude of about 80 nm, not much different from the half amplitude (70 nm to 80 nm) of the general $Sr_2SiO_4$ phosphor, while the second crystal phase phosphor according to Embodiment 1 has a peak wavelength of 618 nm and a drastically increased half amplitude of about 113 nm.

Namely, as shown in FIG. 4, the complex crystal phosphor according to Embodiment 1 has the single peak and the increased half amplitude, although a different crystal such as the β-sialon crystal is complexed thereto.

Of course, the efficiency of the complex crystal phosphor is slightly reduced according to the improvement of the half amplitude, but it can be improved by adding an activator. For example, a conversion efficiency of about 5 to 10% can be improved by adding a certain amount of dysprosium (Dy) together with europium (Eu), thus offsetting the reduction in the amount of light.

The complex crystal phosphors according to Embodiment 1 and the Comparative Example 1 were applied together with a red phosphor in a blue LED chip under the same conditions, so as to manufacture a white light emitting device, and the color rendering indexes of the both complex crystal phosphors were evaluated. The white light emitting device using the complex crystal phosphor according to Comparative Example 1 had a color rendering index of 72.47, while the white light emitting device using the complex crystal phosphor according to Embodiment 1 had a color rendering index of 75.31, which is approximately 40 higher than that of Comparative Example 1.

In this manner, the red phosphor having an emission spectrum with an increased half amplitude can be obtained by preparing the complex crystal phosphor by adding the crystal phase such as β-sialon, whereby the white light emitting device having the high color rendering index can be provided.

Embodiment 2 and Comparative Example 2 were additionally formed as follows.

[Embodiment 2]

A complex crystal phosphor was prepared through a process similar to that of Embodiment 1 such that it has a first crystal corresponding to $Sr_2SiO_4$, a second crystal corresponding to the β-sialon crystal containing aluminum (Al), and an additional third crystal corresponding to $Sr_2Si_5O_8$, compared with Embodiment 1.

Figure 5:
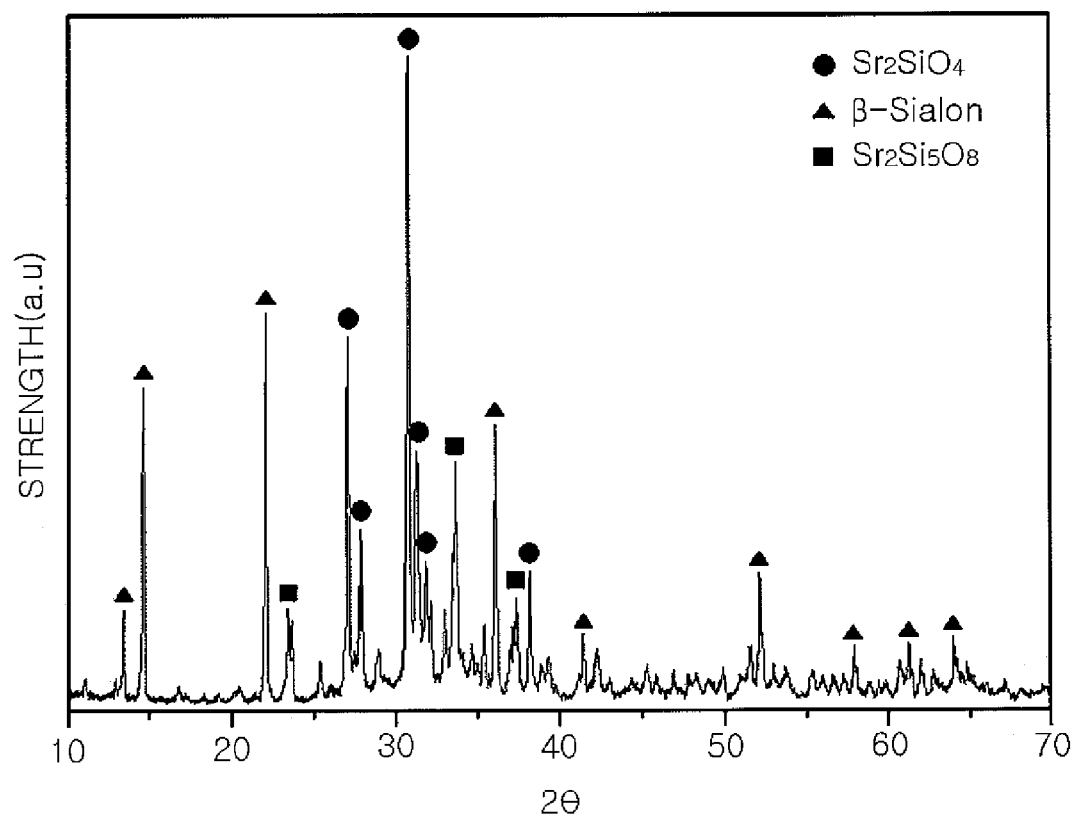
FIG. 5 is an XRD graph of the complex crystal phosphor prepared according to Embodiment 2 of the present invention.

FIG. 5 is an XRD graph of the complex crystal phosphor prepared according to Embodiment 2 of the present invention. As shown in FIG. 5, the peak corresponding to the $Sr_2SiO_4$, the peak corresponding to the β-sialon crystal containing aluminum (Al), and the peak corresponding to the additional $Sr_2Si_5O_8$ crystal were observed.

The first crystal representing the $Sr_2SiO_4$ crystal peak was analyzed to be $Sr_2SiO_{2.55}N_{1.7}$, the second crystal representing the aluminum (A)-contained β-sialon crystal peak was analyzed to be $Si_{5.25}Al_{0.75}O_{0.75}N_{7.25}$. Also, the third crystal corresponding to the $Sr_2Si_5O_8$ crystal peak was analyzed to be $Sr_2Si_5O_{1.3}N_{7.14}$.

Thus, it was confirmed that the complex crystal phosphor prepared according to Embodiment 2 was a quasi-orthorhombic crystal in which the foregoing two crystal phases are mutually employed.

Comparative Example 2

A complex crystal phosphor having two crystal phases was prepared such that the β-sialon crystal containing aluminum (Al) was not formed and $Sr_2Si_5O_8$ crystal was obtained in addition to the same crystal as the $Sr_2SiO_4$ crystal.

The half amplitudes and color renderings of the phosphors obtained according to the foregoing Embodiments 1 and 2 and Comparative Examples 1 and 2 were evaluated and the results are shown in Table 1 below.

TABLE 1

| Classification | Crystal structure | | | Half amplitude (nm) | Color rendering (Ra) |
| --- | --- | --- | --- | --- | --- |
| | $Sr_2SiO_4$ | β-sialon | $Sr_2Si_5O_8$ | | |
| Embodiment 1 | ○ | ○ | X | 113 | 75.31 |
| Embodiment 2 | ○ | ○ | ○ | 92 | 73.16 |
| Embodiment 3 | ○ | X | X | 80 | 72.47 |
| Embodiment 4 | ○ | X | ○ | 85 | 71.09 |

Thus, it was confirmed that the complex crystal phosphors according to Embodiments 1 and 2 of the present invention have a half amplitude which was extended to the level of 90 nm or larger and had the improved color rendering index of 73 or greater, compared with those of Comparative Examples 1 and 2.

Various applications including the phosphor according to an exemplary embodiment of the present invention will now be described with reference to the accompanying drawings.

Figure 6:
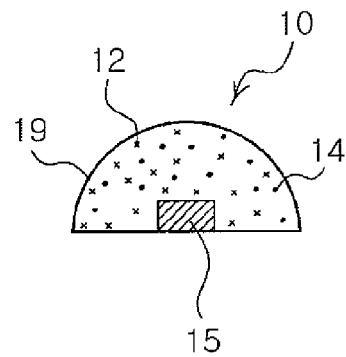
FIG. 6 is a schematic view of a white light emitting device according to an exemplary embodiment of the present invention.

FIG. 6 is a schematic view of a white light emitting device according to an exemplary embodiment of the present invention.

As shown in FIG. 6, a white light emitting device 10 according to an exemplary embodiment of the present invention includes a blue LED chip 15 and a resin packaging part 19 packaging the blue LED chip 15 and having an upwardly convex lens shape.

The resin packaging part 19 according to the present exemplary embodiment is illustrated to have a hemispherical lens shape to secure a large orientation angle. The blue LED chip 15 may be directly mounted on a circuit board. The resin packaging part 19 may be made of a silicon resin, an epoxy resin, or a combination thereof. A green phosphor 12 and a red phosphor 14 are dispersed in the interior of the resin packaging part 19.

As the green phosphor 12 employed according to the present exemplary embodiment, one of an oxynitride phosphor expressed by $M_xA_yO_xN_{(4/3)y}$, an oxynitride phosphor expressed by $M_aA_bO_cN_{((2/3)a+(4/3)b-(2/3)c)}$, and a β-sialon phosphor having a β-type $Si_3N_4$ crystal structure and expressed by $Si_{6-z}Al_zO_zN_{8-z}$ may be used. Here, M is at least one type of a group II element selected from the group consisting of beryllium (Be), magnesium (Mg), calcium (Ca), strontium (Sr), and zinc (Zn), and A is at least one type of a group IV element selected from the group consisting of carbon (C), silicon (Si), germanium (Ge), tin (Sn), titanium (Ti), zirconium (Zr), and hafnium (Hf).

Also, as the green phosphor 12, an oxynitride phosphor having a β-type $Si_3N_4$ crystal structure and expressed by an empirical formula $Si_{6-z}Al_zO_zN_{8-z}:Eu_a,M_b$ may be used together with a different green phosphor or may be used alone. Here, M is at least one selected from among strontium (Sr) and barium (Ba), and the amount (a) of europium (Eu) ranges from 0.1 to 5 mol %, the amount (b) of M ranges from 0.1 to 10 mol %, and a composition rate (z) of aluminum (Al) satisfies 0.1<z<1.

The β-sialon phosphor expressed by $Si_{6-z}Al_zO_zN_{8-z}:Eu_a,M_b$ is a green phosphor which can emit light having a peak wavelength ranging from 500 to 550 nm when an excitation source is irradiated thereto. A certain amount of strontium (Sr) may be added to an empty sphere (i.e., an air gap or pore) of a host matrix, the β-sialon crystal expressed by $Si_{6-z}Al_zO_zN_{8-z}:Eu_a,M_b$, to obtain a green phosphor having a greatly improved luminance (e.g., approximately 20%) and having a shorter wavelength of 540 nm or lower, compared with the conventional β-sialon phosphor.

The β-sialon green phosphor expressed by $Si_{6-z}Al_zO_zN_{8-z}$: $Eu_a,M_b$ can provide color characteristics satisfying a standard RGB (sRGB) green area in a CIE 1931 color coordinate system, contributing to provide vivid (clear, sharp) white color. Also, the addition (or doping) of strontium (Sr) can contribute to phase stabilization of β-sialon, improving the reliability thereof, in particular, significantly reducing a change in y color coordinate which holds sway over an efficiency change over time, and obtaining a great improvement effect in the aspect of productivity and production yield.

Meanwhile, as for the red phosphor 14 which can be employed in the present exemplary embodiment, a different red phosphor may additionally be mixed to be used besides the foregoing complex crystal phosphor. For example, the additionally used red phosphor may be at least one selected from among a nitride-based phosphor of $M1AlSiN_x$:Re ($1 \leq x \leq 5$), a sulfide-based phosphor of M1D:Re, and a silicate-based phosphor of $(Sr,L)_2SiO_{4-x}N_y$:Eu (Here, $0 < x < 4$, $y=2x/3$).

Here, M1 is at least one element selected from among barium (Ba), strontium (Sr), calcium (Ca), and magnesium (Mg), D is at least one element selected from among sulfur (S), selenium (Se), and tellurium (Te), L is at least one group II element selected from among Ba, Ca, and Mg, or at least one group I element selected from the group consisting of lithium (Li), sodium (Na), potassium (K), rubidium (Rb), and cesium (Cs), D is at least one element selected from among sulfur (S), selenium (Se), and tellurium (Te), and Re is at least one element selected from among yttrium (Y), lanthanum (La), cerium (Ce), neodymium (Nd), promethium (Pm), samarium (Sm), gadolinium (Gd), terbium (Tb), dysprosium (Dy), holmium (Ho), erbium (Er), thulium (Tm), ytterbium (Yb), lutetium (Lu), F, chlorine (Cl), bromine (Br), and iodine (I).

In this manner, since a particular green phosphor and a particular red phosphor are provided in the form of a combination in consideration of the half amplitude, the peak wavelength, and/or the conversion efficiency, etc., white light having a high color rendering index of 70 or higher can be provided. Also, because light of various wavelength bands is obtained through a plurality of phosphors, the color reproducibility (or color gamut) can be improved.

In the case of the silicate-based red phosphor, among the red phosphors, preferably, the range of x may be $0.15 \leq x \leq 3$. In the empirical formula, a portion of silicon (Si) may be substituted with a different element. For example, it may be substituted with at least one element selected from the group consisting of boron (B), aluminum (Al), gallium (Ga), and indium (In). Alternatively, it may be substituted with at least one element selected from the group consisting of titanium (Ti), zirconium (Zr), Gf, tin (Sn), and lead (Pb).

A main wavelength of the blue ED chip may range from 430 nm to 470 nm. In this case, in order to improve the color rendering index by securing a wider spectrum in the visible spectrum, the light emission wavelength peak of the green phosphor 12 may range from 500 nm to 550 nm and that of the red phosphor 14 may range from 600 nm to 660 nm.

Preferably, the blue LED chip has a half amplitude ranging from 10 nm to 50 nm, the green phosphor has a half amplitude ranging from 30 nm to 200 nm, and the red phosphor has a half amplitude ranging from 50 nm to 250 nm.

In a different exemplary embodiment, a yellow phosphor or a yellowish-orange phosphor may be included in addition to the foregoing red phosphor 14 and the green phosphor 12. In this case, a more improved color rendering index can be obtained. This embodiment is illustrated in FIG. 8.

Figure 8:
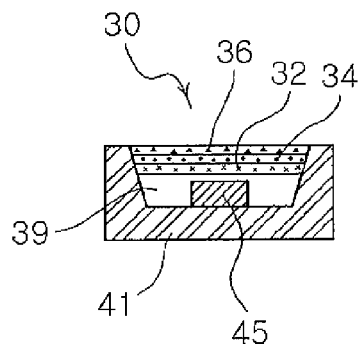

With reference to FIG. 8, a white light emitting device 20 includes a package main body 21 having a reflective cup formed at the center thereof, a blue LED chip 25 mounted on the bottom of the reflective cup, and a transparent resin packaging part 29 encapsulating the blue LED chip 25 within the reflective cup.

The resin packaging part 29 may be made of, for example, a silicon resin, an epoxy resin, or a combination thereof. In the present exemplary embodiment, the resin packaging part 29 may include a green phosphor 22, a red phosphor 22, and an additional yellow or yellowish-orange phosphor 26.

Namely, the green phosphor 22 may include at least one among an $M_xA_yO_xN_{(4/3)y}$ oxynitride phosphor, an $M_aA_bO_cN_{((2/3)a+(4/3)b-(2/3)c)}$ oxynitride phosphor, and a β-sialon phosphor. The red phosphor 24 may further include at least one among a nitride-based $M1AlSiN_x$:Re phosphor ($1 \leq x \leq 5$) and a sulfide-based phosphor of M1D:Re, besides the foregoing complex crystal phosphor.

Also, in the present exemplary embodiment, the third phosphor 26 may be further included. The third phosphor may be a yellow or a yellowish-yellowish-orange phosphor which can emit light from a wavelength band positioned in the middle of the green and red wavelength bands. The yellow or yellowish-orange phosphor may be a silicate-based phosphor. The yellowish-orange phosphor may be a α-SiAlON:Re-based or a garnet-based phosphor of YAG and TAG.

In the foregoing exemplary embodiment, the case in which two or more types of phosphor powder are mixed to be dispersed in the single resin packaging part area, but various other structures may be implemented. In detail, the two or three types of phosphors may be formed to have a structure in which they form different layers. For example, the green phosphor, the red phosphor, and the yellow or yellowish-orange phosphor may be provided as phosphor layers in a multilayered structure by dispersing the corresponding types of phosphor powder at a high pressure.

Figure 9:
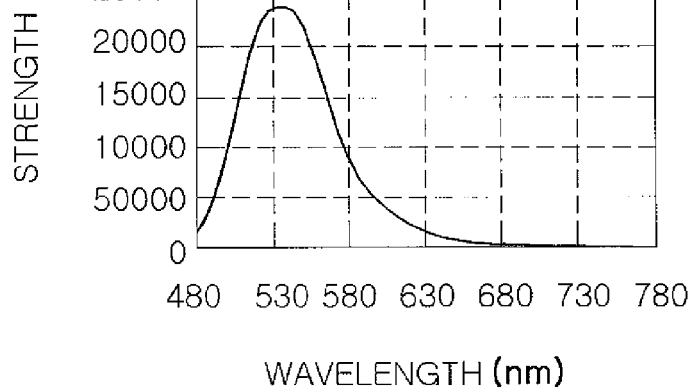
FIG. 9 is a graph of a spectrum of a green phosphor which can be employed in an exemplary embodiment of the present invention.

Alternatively, as shown in FIG. 9, like the white light emitting device of the former exemplary embodiment, a white light emitting device 30 according to the present exemplary embodiment includes a package main body 41 having a reflective cup formed at the center thereof, a blue LED chip 45 mounted on the bottom of the reflective cup, and a transparent resin packaging part 39 encapsulating the blue LED chip 45 within the reflective cup.

A resin layer including different phosphor layers is provided on the resin packaging part 39. Namely, a wavelength conversion unit may be configured to include a first resin layer 32 containing the green phosphor, a second resin layer 34 containing the red phosphor, and a third resin layer 36 containing the yellow or yellowish-orange phosphor.

The phosphor used in the present exemplary embodiment may be the same as or similar to the phosphor described above with reference to FIG. 5.

White light obtained by combining the phosphors proposed in the present exemplary embodiment can obtain a high color rendering index. More specifically, when the yellow phosphor is combined with the blue LED chip, converted yellow light can be obtained together with blue wavelength light. In this case, since there is little light from the green and red wavelength bands when viewed in the overall visible spectrum, it is difficult to obtain a color rendering index close to natural light. In particular, the converted yellow light has a narrow half amplitude so as to obtain high conversion efficiency, further lowering the color rendering index. In addition, since the characteristics of manifested white light are easily changed according to the degree of single yellow conversion, failing to guarantee excellent color reproducibility.

In comparison, in the exemplary embodiment in which the red LED chip and the green phosphor (G) and the red phosphor (R) are combined, because light is emitted in the green and red bands, compared with the existing example, a wider spectrum can be obtained from the visible spectrum, resulting in a great improvement in the color rendering index. Additionally, the color rendering index can be further improved by including the yellow or yellowish-orange phosphor which provides the middle wavelength band between the green and red bands.

FIG. 9 is a graph showing an emission spectrum of the green phosphor employed in an exemplary embodiment of the present invention. As shown in FIG. 9, the red phosphor obtained from the oxynitride phosphor according to an exemplary embodiment of the present invention has a peak wavelength of approximately 540 nm and an emission spectrum having a half amplitude of 76.7 nm.

Figure 10A:
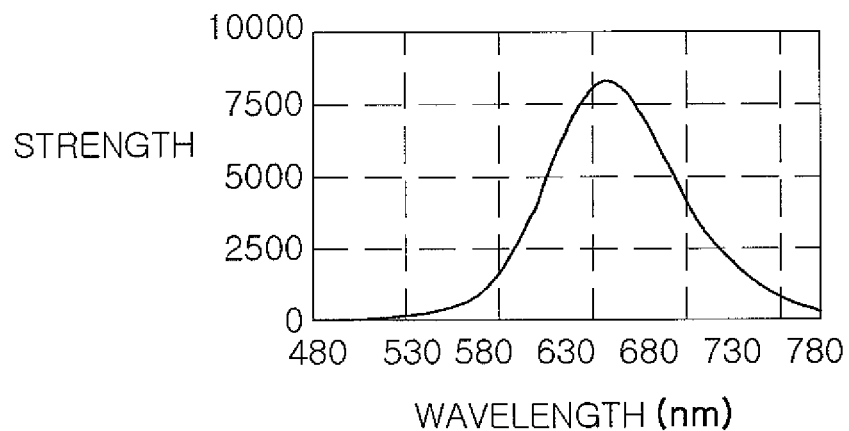
FIGS. 10A and 10B are graphs of spectrums of a red phosphor which can be employed in an exemplary embodiment of the present invention.
Figure 10B:
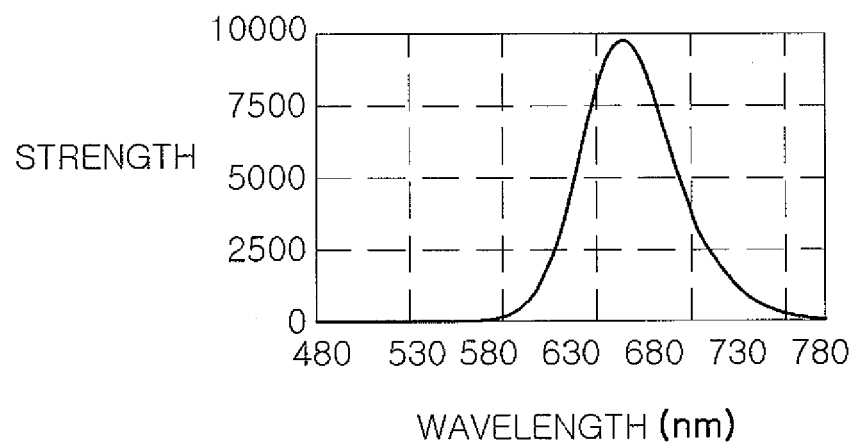

FIGS. 10A and 10B are graphs showing emission spectrums of the red phosphor which can be additionally employed in an exemplary embodiment of the present invention.

With reference to FIG. 10A, the spectrum of a nitride-based phosphor of $MAlSiN_x$:Re ($1 \leq x \leq 5$) (Here, M is at least one element selected from among beryllium (Be), barium (Ba), strontium (Sr), calcium (Ca), and magnesium (Mg), and Re is at least one element selected from among yttrium (Y), lanthanum (La), cerium (Ce), neodymium (Nd), promethium (Pm), samarium (Sm), gadolinium (Gd), terbium (Tb), dysprosium (Dy), holmium (Ho), erbium (Er), thulium (Tm), ytterbium (Yb), lutetium (Lu), F, chlorine (Cl), bromine (Br), and iodine (I)) is shown. The converted red light has a peak wavelength of approximately 640 nm and a half amplitude of approximately 85 nm.

With reference to FIG. 10B, the spectrum of a sulfide-based phosphor of MD:Eu,Re (Here, M is at least one element selected from among beryllium (Be), barium (Ba), strontium (Sr), calcium (Ca), and magnesium (Mg), D is at least one element selected from among sulfur (S), selenium (Se), and tellurium (Te), and Re is at least one element selected from among yttrium (Y), lanthanum (La), cerium (Ce), neodymium (Nd), promethium (Pm), samarium (Sm), gadolinium (Gd), terbium (Tb), dysprosium (Dy), holmium (Ho), erbium (Er), thulium (Tm), ytterbium (Yb), lutetium (Lu), F, chlorine (Cl), bromine (Br), and iodine (I)) is shown. The converted red light has a peak wavelength of approximately 655 nm, and a half amplitude of approximately 55 nm.

Figure 11A:
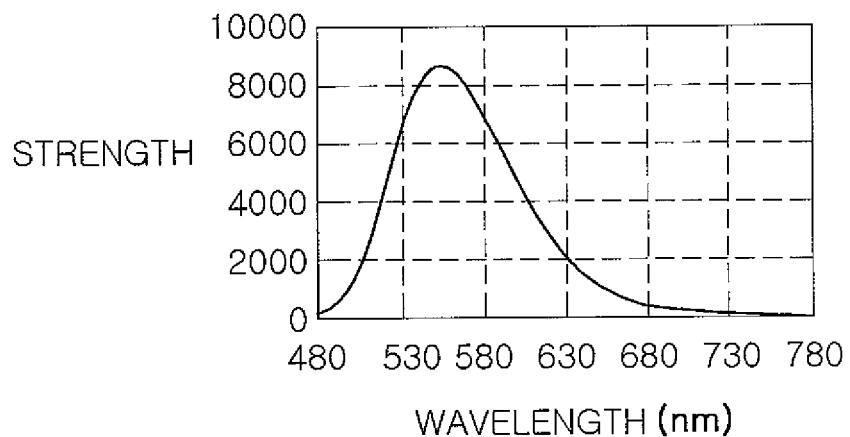
FIGS. 11A and 11B are graphs of a yellow or a yellowish-orange phosphor which can be employed in an exemplary embodiment of the present invention.
Figure 11B:
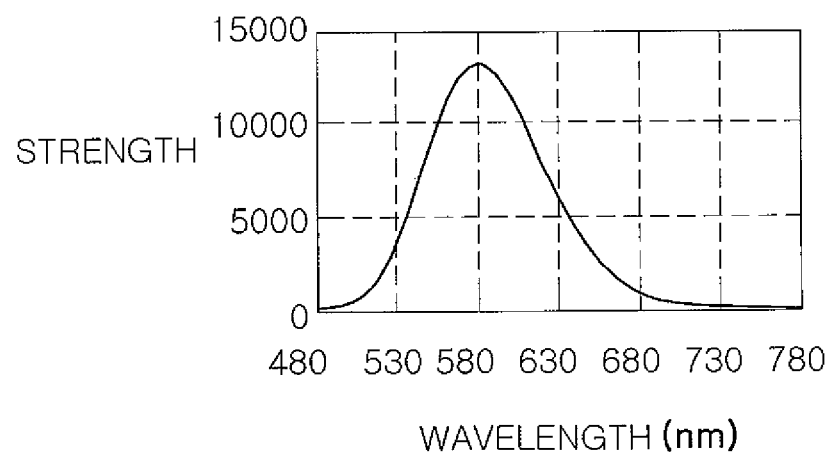

FIGS. 11A and 11B are graphs showing emission spectrums of the yellow or yellowish-orange phosphor which can be selectively employed in an exemplary embodiment of the present invention.

With reference to FIG. 11A, the spectrum of a silicate-based phosphor is shown. The converted yellow light has a peak wavelength of approximately 555 nm, and a half amplitude of approximately 90 nm.

With reference to FIG. 11B, the spectrum of a α-SiAlON: Re phosphor (Here, Re is at least one element selected from among yttrium (Y), lanthanum (La), cerium (Ce), neodymium (Nd), promethium (Pm), samarium (Sm), gadolinium (Gd), terbium (Tb), dysprosium (Dy), holmium (Ho), erbium (Er), thulium (Tm), ytterbium (Yb), lutetium (Lu), F, chlorine (Cl), bromine (Br), and iodine (I), and Re is within the range of 1 ppm to 50000 ppm) is shown. The converted yellow light has a peak wavelength of approximately 580 nm and a half amplitude of approximately 88 nm.

In this manner, since a particular green phosphor and a particular red phosphor are provided in the form of a combination in consideration of the half amplitude, the peak wavelength, and/or the conversion efficiency, etc., and a yellow or yellowish orange phosphor is added to the combination, white light having a high color rendering index of 70 or higher can be provided.

As for color coordinates of the red light, x and y coordinates are within the range of $0.55 \leq x \leq 0.65$ and $0.25 \leq y \leq 0.35$, respectively, as for the color coordinates of the green light, x and y coordinates are within the range of $0.2 \leq x \leq 0.4$ and $0.5 \leq y \leq 0.7$, respectively, and as for the color coordinates of the blue light, x and y coordinates are within the range of $0.1 \leq x \leq 0.2$ and $0.02 \leq y \leq 0.15$, respectively.

When a main wavelength of the blue LED chip ranges from 430 nm to 470 nm, a light emission wavelength peak of the green phosphor may range from 500 nm to 550 nm, that of the red phosphor may range from 600 nm to 660 nm, and that of the yellow or yellowish-orange phosphor may range from 550 nm to 600 nm.

Also, when the blue LED chip has a half amplitude ranging 10 nm to 50 nm, the green phosphor may have a half amplitude ranging from 30 nm to 200 nm, and preferably, ranging from 60 nm to 80 nm, the red phosphor may have a half amplitude ranging from 50 nm to 250 nm, and the yellow to yellowish-orange phosphor may have a half amplitude ranging from 20 nm to 100 nm.

Through the selection and combination of the respective phosphors under such conditions, in an exemplary embodiment of the present invention, a wide spectrum can be secured in the visible spectrum, and excellent white light having a larger color rendering index can be provided.

Figure 12:
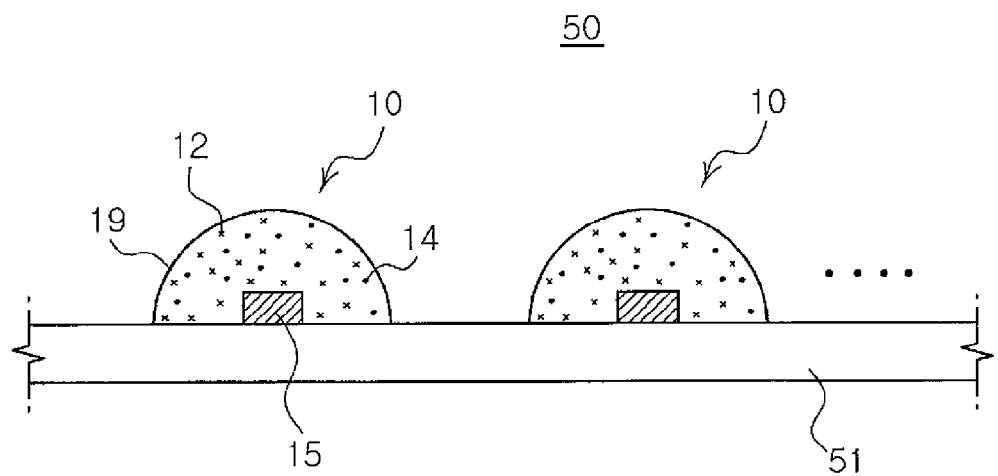
FIG. 12 is a side sectional view of an LED light source module according to an exemplary embodiment of the present invention.
Figure 13:
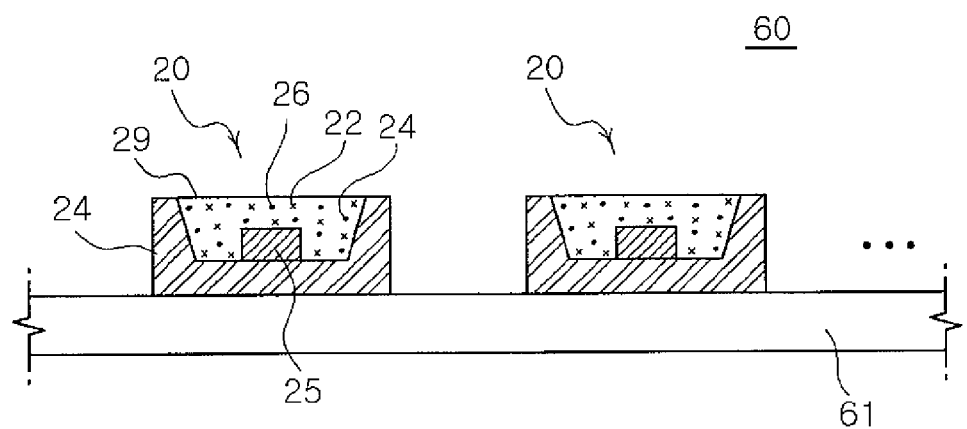
FIG. 13 is a side sectional view of an LED light source module according to another exemplary embodiment of the present invention.

The present invention can provide a white light source module advantageously used as a light source of an LCD backlight unit. Namely, the white light source module according to an exemplary embodiment of the present invention can be coupled, as a light source of the LCD backlight unit, with various optical members (a diffuser, a light guide plate, a reflective plate, a prism sheet, and the like) to configure a backlight assembly. FIGS. 12 and 13 illustrate such white light source modules.

First, with reference to FIG. 12, a light source module 50 for an LCD backlight includes a circuit board 51 and an array of a plurality of white LED devices 10 mounted on the circuit board 51. A conductive pattern (not shown) may be formed on an upper surface of the circuit board 51 such that it is connected to the LED devices 10.

Figure 7:
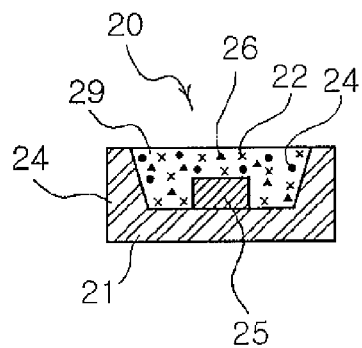
FIGS. 7 and 8 are schematic views of a white light emitting device according to another exemplary embodiment of the present invention.

Each of the white LED devices 10 may be understood as the white LED device described above with reference to FIG. 7. Namely, the blue LED 15 is directly mounted in a COB (Chip On Board) manner on the circuit board 51. Each of the white LED devices 10 may be configured to include the hemispherical resin packaging part 19 having a lens function without a reflective wall, thus having a wide orientation angle. The wide orientation angle of each of the white light sources may contribute to a reduction in the size (i.e., the thickness or the width) of an LCD display.

With reference to FIG. 13, a light source module 60 for an LCD backlight includes a circuit board 61 and an array of a plurality of white LED devices 20 mounted on the circuit board 61. As described above with reference to FIG. 8a, the white LED devices 20 includes the blue LED chip 25 mounted within a reflective cup of the package main body 21 and the resin packaging part 29 encapsulating the blue LED chip 25. The green phosphor 22 and the yellow or yellowish-orange phosphor 26, together with the red phosphor 24 including the foregoing complex crystal phosphor, are dispersed in the resin packaging part 29.

Various types of white light emitting devices using the foregoing phosphors as wavelength conversion materials can be implemented according to exemplary embodiments of the present invention. Hereinafter, a luminous element which can be employed for the white light emitting device according to an exemplary embodiment of the present invention will now be described.

Figure 14:
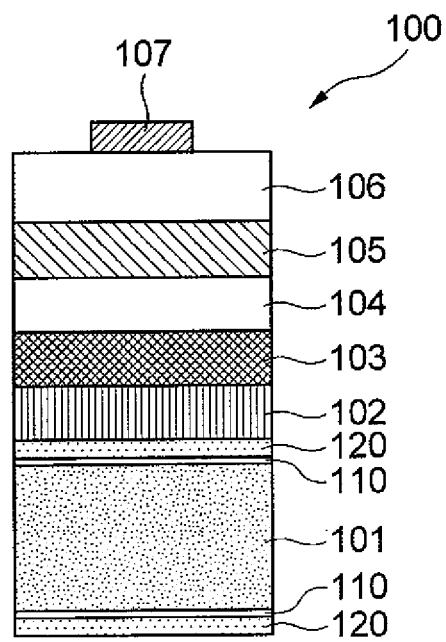
FIG. 14 is a side sectional view showing an example of a luminous element which can be employed in a white light emitting device according to an exemplary embodiment of the present invention.

First, a semiconductor stacked structure of a luminous element 100 illustrated in FIG. 14 may have the following structure. A substrate made of an Si—Al alloy (referred to as a 'Si—Al alloy substrate', hereinafter) is formed, a protective layer 120 is formed on upper and lower surfaces of the Si—Al alloy substrate 101, and a junction metal layer 102, a reflective metal layer 103, a p type semiconductor layer 104, an active layer 105, and an n type semiconductor layer 106 are sequentially stacked on the protective layer 120. The p type and n type semiconductor layers 104 and the active layer 105 may be made of a GaN-based semiconductor, namely, $Al_xGa_yIn_{(1-x-y)}N$ ($0 \leq x \leq 1$, $0 \leq y \leq 1$ $0 \leq x+y \leq 1$) semiconductor material, or the like, and constitute a light emission structure.

An n-sided electrode 107 is formed on the n type semiconductor layer 106. The reflective metal layer 103 interposed between the junction metal layer 102 and the p type semiconductor layer 104 reflects light upwardly, which is made incident from the semiconductor layer, to thus increase the luminance of the light emitting element. The reflective metal layer 103 may be made of a metal having a high level of reflectivity, e.g., a metal selected from the group consisting of gold (Au), silver (Ag), aluminum (Al), and rhodium (Rh), or an alloy of two or more thereof. The reflective metal layer 103 may be omitted as necessary.

The junction metal layer 102 serves to connect the Si—Al alloy substrate 101 to the light emission structure. The junction metal layer 102 may be made of gold (Au), or the like. Here, the luminous element 100 includes the junction metal layer 102, but the Si—Al alloy substrate 101 may be directly connected to the p type semiconductor layer 104 without the junction metal layer 102 therebetween. Thus, the luminous element 100 according to an exemplary embodiment of the present invention uses the Si—Al alloy substrate 101 as a conductive substrate.

The Si—Al alloy is advantageous in terms of thermal expansion coefficient, heat conductivity, mechanical processability and cost. Namely, the thermal expansion coefficient of the Si—Al alloy substrate 101 is similar to that of a sapphire substrate. Thus, when the luminous element 100 is manufactured by using the Si—Al alloy substrate 101, a phenomenon in which a substrate is bent, occurring in a process of bonding an existing conductive substrate made of silicon (Si) and a process of separating a sapphire substrate according to laser irradiation, and crack generation in a light emission structure can be drastically reduced to obtain a high quality luminous element 100 with reduced defects.

Also, the heat conductivity of the Si—Al alloy substrate 101 ranges from 120 to 180 W/m·K, providing excellent heat releasing characteristics. Also, because the Si—Al alloy substrate 101 can be easily manufactured by melting silicon (Si) and aluminum (Al) at a high pressure, it can be easily obtained at a low cost.

In particular, the luminous element 100 according to the present exemplary embodiment includes the protective layer 120 formed on the upper and lower surfaces of the Si—Al alloy substrate 101 in order to prevent a chemical infiltration to the Si—Al alloy substrate 101 during a cleaning operation. Here, the protective layer 120 may be made of a metal or a conductive dielectric, or the like. When the protective layer 120 is made of a metal, it may be made of at least one of nickel (Ni), gold (Au), copper (Cu), tungsten (W), chromium (Cr), molybdenum (Mo), platinum (Pt), ruthenium (Ru), rhodium (Rh), titanium (Ti), and tantalum (Ta), or an alloy of at least two or more thereof.

In this case, the protective layer 120 may be formed through an electroless plating method, metal deposition, sputtering, CVD, or the like, and a seed metal layer 110 serving as a seed in the process of plating the protective layer 120 may be formed between the Si—Al alloy substrate 101 and the protective layer 120 made of a metal material. The seed metal layer 110 may be made of titanium (Ti)/gold (Au), or the like. Also, when the protective layer 120 is made of a conductive dielectric, the conductive dielectric may be made of ITO (Indium Tin Oxide), IZO (Indium Zinc Oxide), or CIO (Copper Indium Oxide). In this case, the protective layer 120 may be formed through deposition, sputtering, or the like. Preferably, the protective layer 120 may be formed to have a thickness ranging from 0.01 μm to 20 μm, and more preferably, it is formed to have a thickness ranging from 1 μm to 10 μm.

In this manner, in the luminous element which can be employed for the white light emitting device according to an exemplary embodiment of the present invention, since the protective layer 120 made of a material such as nickel (Ni) is formed on the surface of the Si—Al alloy substrate 101, the Al metal of the Si—Al alloy substrate 101 can be prevented from being etched by chemicals such as HCL, HF, KOH, or the like, used in a cleaning process performed after the sapphire substrate is separated or by the chemical such as KOH used in a process of texturing the surface of the n type semiconductor layer 106.

Thus, in the luminous element which can be employed for the white light emitting device according to an exemplary embodiment of the present invention, formation of protrusions and depressions on the surface of the Si—Al alloy substrate 101 can be prevented, and thus, the light emission structure bonded to the Si—Al alloy substrate 101 can be prevented from being peeled off.

The use of the metal such as nickel (Ni) or the like, as a material of the protective layer 120 is advantageous in that the surface roughness of the Si—Al alloy substrate 101 can be improved to solidify the junction (or bonding) between the Si—Al alloy substrate 101 and the light emission structure. Namely, in the related art, before the formation of the junction metal layer 102, the Si—Al alloy substrate 101 undergoes a cleaning process using a chemical material such as an acid, or the like, to remove a natural oxide layer, so the Al metal on the surface of the Si—Al alloy substrate 101 is etched to result in the formation of protrusions and depressions ranging from 200 nm to 500 nm on average on the surface of the Si—Al alloy substrate 101. Comparatively, in the first exemplary embodiment of the present invention, the metal such as nickel (Ni), or the like, is formed as the protective layer 120 on the surface of the Si—Al alloy substrate 101 and the Si—Al alloy substrate 101 is subjected to an Ni CMP (Chemical Mechanical Polishing) process. Thus, the surface protrusions and depressions can be reduced to 5 nm or smaller, improving the surface roughness to appear like a mirror face.

Thus, the surface roughness of the Si—Al alloy substrate 101, the junction between the Si—Al alloy substrate 101 and the light emission structure can be solidified and the junction yield can be improved.

Figure 15:
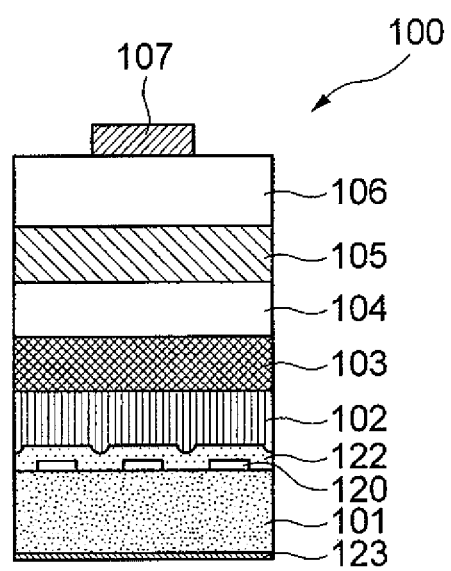
FIG. 15 is a side sectional view showing an example of a luminous element which can be employed in a white light emitting device according to another exemplary embodiment of the present invention.

FIG. 15 shows another example of a luminous element which can be employed for the white light emitting device according to an exemplary embodiment of the present invention.

The luminous element illustrated in FIG. 15 is similar to the luminous element illustrated in FIG. 14, except that the protective layer 120 is formed on the upper surface of the Si—Al alloy substrate 101 such that portions of the Si—Al alloy substrate 101 are exposed, rather than being formed on the entirety of the upper and lower surfaces of the Si—Al alloy substrate 101, a conductive layer 122 is formed on the protective layer 120 and on the portions of the upper surface of the Si—Al alloy substrate 101 exposed by the protective layer 120, and a contact metal layer 123 is formed on a lower surface of the Si—Al alloy substrate 101.

In particular, preferably, the protective layer 120 is made of an insulating material, rather than of a conductive dielectric. Namely, in the luminous element 100 according to the present exemplary embodiment, since the protective layer 120 is made of an insulating material, rather than a metal or a conductive dielectric, the protective layer 120 is formed to expose portions of the upper surface of the Si—Al alloy substrate 101 and the conductive layer 122 is additionally formed on the upper surface of the Si—Al alloy substrate 101 including the protective layer 120, in order to allow the Si—Al alloy substrate 101 with the protective layer 120 formed thereon and the light emission structure at the upper side of the protective layer 120 to be electrically connected. Here, the conductive layer 122 may be made of a metal, or the like.

Figure 16:
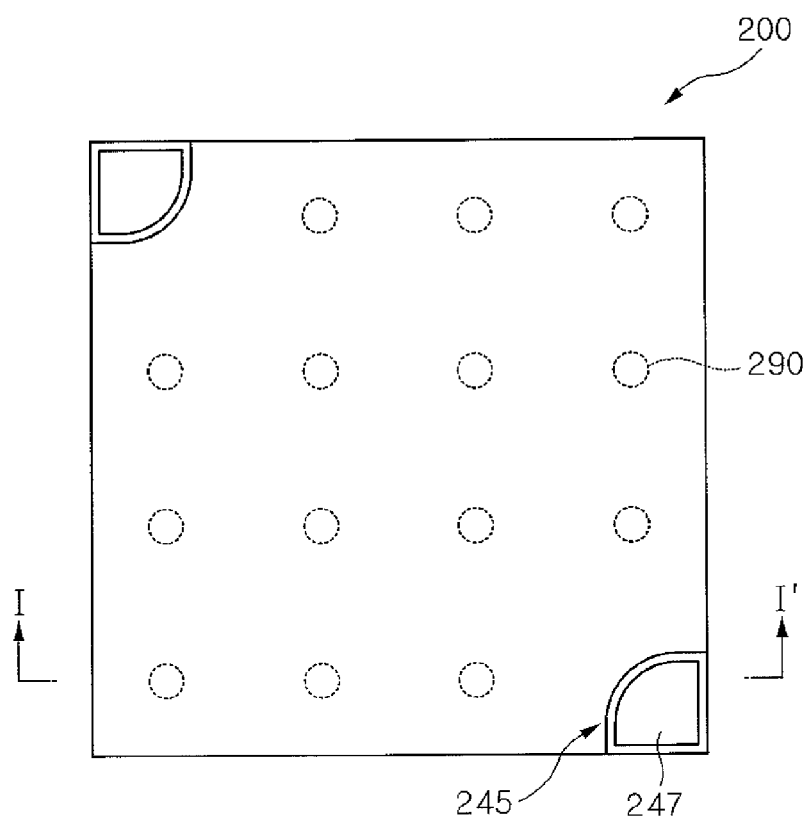
FIGS. 16 and 17 are a plan view and a side sectional view showing an example of a luminous element which can be employed in a white light emitting device according to an exemplary embodiment of the present invention.
Figure 17:
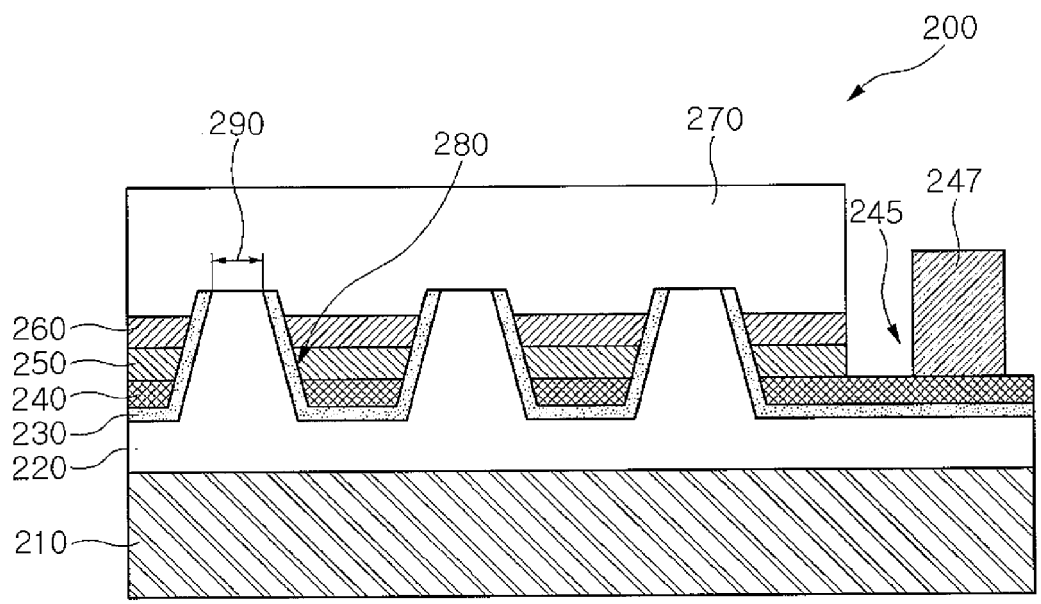

Meanwhile, unlike the luminous element having the configuration as described above, the white light emitting device according to the present exemplary embodiment may employ a luminous element having an electrode disposition structure modified to allow for a high current operation. FIGS. 16 and 17 are a plan view and a side sectional view showing an example of a luminous element which can be employed in a white light emitting device according to an exemplary embodiment of the present invention. FIG. 17 is a sectional view taken along line I-I' in FIG. 16.

With reference to FIGS. 16 and 17, a luminous element 200 includes a conductive substrate 210, a first electrode layer 22, an insulating layer 230, a second electrode layer 240, a second conductive semiconductor layer 250, an active layer 260, and a first conductive semiconductor layer 270, and the respective layers are sequentially stacked.

The conductive substrate 210 may be made of a material allowing electricity to flow therethrough. For example, preferably, the conductive substrate 210 may be a metal substrate including at least one of metals among gold (Au), nickel (Ni), copper (Cu), and tungsten (W), or may be a semiconductor substrate including any one of silicon (Si), germanium (Ge), and gallium arsenide (GaAs). The first electrode layer 220 is stacked on the conductive substrate 210. The first electrode layer 220 is electrically connected to the conductive substrate 210 and the active layer 260, so preferably, it is made of a material for minimizing contact resistance with the conductive substrate 210 and the active layer 260.

As shown in FIG. 17, portions of the first electrode layer 220 stacked on the conductive substrate 210 penetrate the insulating layer 230, the second electrode layer 240, the second conductive semiconductor layer 250, and the active layer 260, and extend through contact holes 280 penetrating even up to a certain area of the first conductive semiconductor layer 270 so as to be brought into contact with the first conductive semiconductor layer 270, thus electrically connecting the conductive substrate 210 and the conductive semiconductor layer 270. Namely, the first electrode layer 220 electrically connects the conductive substrate 210 and the conductive semiconductor layer 270 through the contact holes 280, so the first electrode layer 220 and the conductive semiconductor layer 270 are electrically connected through the size of the contact holes 280, more accurately, through contact areas 290, in which they are in contact.

Meanwhile, the insulating layer 230 is provided on the first electrode layer 220 in order to electrically insulate the first electrode layer 220 from other layers, except for the conductive substrate 210 and the first conductive semiconductor layer 270. Namely, the insulating layer 230 is provided between the sides of the second electrode layer 220, the second conductive semiconductor layer 250, and the active layer 260 exposed by the contact hole 280 and the first electrode layer 220, as well as between the first electrode layer 220 and the second electrode layer 240. Also, preferably, the insulating layer 230 is also formed to the side of a certain area of the first conductive semiconductor layer 270 which is penetrated by the contact hole 280 to insulate the same.

The second electrode layer 240 is provided on the insulating layer 230. Of course, the second electrode layer does not exist in the certain areas in which the contact holes 280 are formed in a penetrative manner. In this case, as shown in FIG. 17, the second electrode layer 240 includes an exposed area of the interface in contact with the second conductive semiconductor layer 250, namely, at least one exposed area 245. An electrode pad part 247 may be provided on the exposed area 245 in order to connect external power to the second electrode layer 240.

Meanwhile, the second conductive semiconductor layer 250, the active layer 260, and the first conductive semiconductor layer 270 (to be provided) do not exist on the exposed area 245. Also, as shown in FIG. 16, preferably, the exposed area 245 is formed on the corner of the semiconductor light emitting device 200 in order to maximize a light emission area of the semiconductor light emitting device 200. Meanwhile, preferably, the second electrode layer 240 includes at least one of metals among silver (Ag), aluminum (Al), and platinum (Pt). This is due to the fact that as the second electrode layer 240 is electrically in contact with the second conductive semiconductor layer 250, it needs to be provided as a layer having the characteristics of minimizing contact resistance of the second conductive semiconductor layer 250 and having the function of outwardly reflecting light generated from the active layer to thus increase luminous efficiency.

The second conductive semiconductor layer 250 is provided on the second electrode layer 240, and the active layer 260 is provided on the second conductive semiconductor layer 250, and the first conductive semiconductor layer 270 is provided on the active layer 260. In this case, preferably, the first conductive semiconductor layer 270 is an n type nitride semiconductor, and the second conductive semiconductor layer 250 is a p type nitride semiconductor. Meanwhile, the active layer 260 may be formed with a material selected according to the material of the first and second conductive semiconductor layers 270 and 250. Namely, the active layer 260 changes energy into light according to electron hole recombination and emits the light, so preferably, the active layer 260 is made of a material having an energy band gap smaller than that of the first and second conductive semiconductor layers 270 and 250.

Meanwhile, in the luminous element according to the present exemplary embodiment, the first electrode layer connected to the contact hole may be exposed to the outside.

Figure 18:
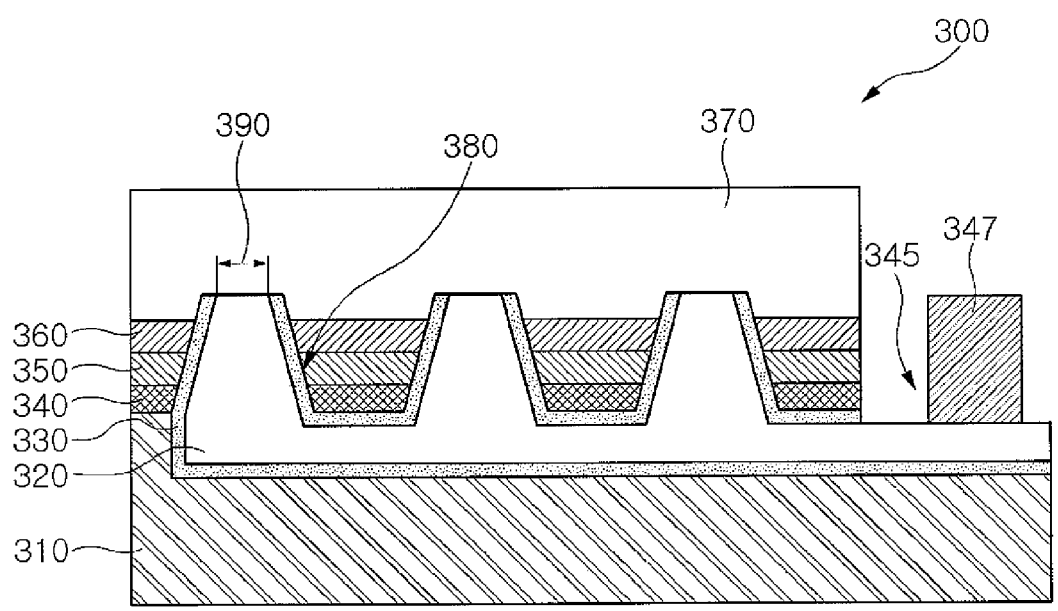
FIG. 18 is a side sectional view showing an example of a luminous element which can be employed in a white light emitting device according to another exemplary embodiment of the present invention.

In the case of a luminous element 300 illustrated in FIG. 18, a second conductive semiconductor layer 350, an active layer 360, and a second conductive semiconductor layer 370 are formed on a conductive substrate 310. In this case, a second electrode layer 340 may be disposed between the second conductive semiconductor layer 350 and the conductive substrate 310, but the second electrode layer 340 is not necessarily formed.

In the present exemplary embodiment, a contact hole 390 having a contact area 390 in contact with the first conductive semiconductor layer 370 is connected to the first electrode layer 320, and the first electrode layer 320 is exposed to have an electricity connection part 345. An electrode pad part 347 may be formed on the electricity connection part 345. The first electrode layer 320 may be electrically separated from the active layer 360, the second conductive semiconductor layer 350, the second electrode layer 340, and the conductive substrate 310 by means of an insulating layer 330.

Unlike the former exemplary embodiment in which the contact hole is connected to the conductive substrate, in the present exemplary embodiment, the contact hole 380 is electrically separated from the conductive substrate 310, and the first electrode layer 320, connected to the contact hole, 380 is exposed to the outside. Accordingly, the conductive substrate 310 is electrically connected to the second conductive semiconductor layer 340 to have a polarity changed as compared to that of the former exemplary embodiment.

Accordingly, in the light emitting element, a portion of a first electrode is formed on the light emission surface and the other portion of the first electrode is disposed at the lower side of the active layer, thus securing a light emission area to have a maximum possible level, and since the electrode disposed on the light emission surface is uniformly disposed, although a high operation current is applied thereto, the current can be uniformly distributed to thus reduce a current concentration in a high current operation.

In this manner, the luminous element s illustrated in FIGS. 17 and 18 may include a semiconductor stacked body having first and second conductive semiconductor layers providing first and second main surfaces opposed to each other and an active layer formed between the first and second conductive semiconductor layers, a contact hole connected to one area of the first conductive semiconductor layer from the second main surface through the active layer, a first electrode formed on the second main surface of the semiconductor stacked body and connected to one area of the first conductive semiconductor layer through the contact hole, and a second electrode formed on the second conductive semiconductor layer formed on the second main surface of the semiconductor stacked body. Here, any one of the first and second electrodes may be drawn out laterally from the semiconductor stacked body.

Figure 19A:
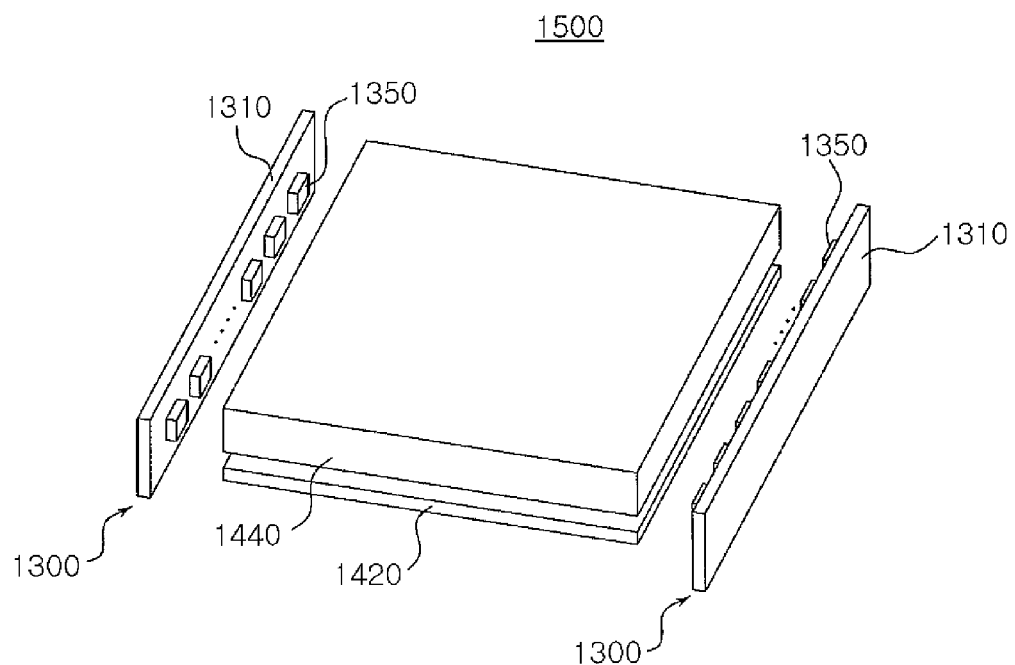
FIGS. 19A and 19B are sectional views of a backlight unit according to exemplary embodiments of the present invention.
Figure 19B:
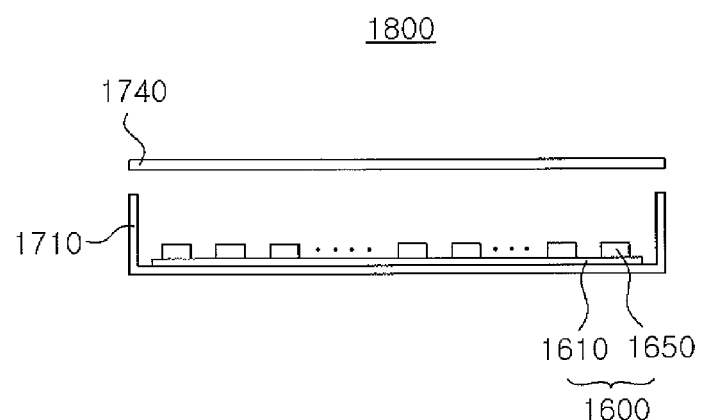

FIGS. 19A and 19B are sectional views of a backlight unit according to exemplary embodiments of the present invention.

With reference to FIG. 19A, an edge type backlight unit 1500 is illustrated as an example of a backlight unit to which a light emitting diode package according to an exemplary embodiment of the present invention can be applicable as a light source.

In the present exemplary embodiment, the edge type backlight unit 1500 may include a light guide plate 1340 and an LED light source module 1300 provided on both sides of the light guide plate 1440.

In the present exemplary embodiment, the LED light source module 1300 is provided on both sides of the light guide plate 1440 opposed to each other, but the LED light source module 1300 may be provided only to one side, or alternatively, an additional LED light source module may be provided to the other side.

As shown in FIG. 19A, a reflective plate 1420 may be additionally provided under the light guide plate 1440. The LED light source module 1300 employed according to the present exemplary embodiment includes a printed circuit board 1310 and a plurality of LED light sources 1350 mounted on the upper surface of the substrate 1310, and the light emitting device package using the foregoing phosphors is applied as the LED light source 1350.

With reference to FIG. 19B, a direct type backlight unit 1800 is illustrated as an example of a different type of backlight unit.

In the present exemplary embodiment, the direct type backlight unit 1800 may include a light diffuser 1740 and an LED light source module 1600 arranged on a lower surface of the light diffuser 1740.

The backlight unit 1800 illustrated in FIG. 19b may further include a bottom case 1710 for accommodating the light source modules at a lower side of the light diffuser 1740.

The LED light source module 1600 employed in the present exemplary embodiment includes a PCB 1610 and a plurality of LED light sources 1650 mounted on an upper surface of the substrate 1610. The plurality of LED light sources may be a light emitting device package using the foregoing phosphors as wavelength conversion materials.

Besides the foregoing exemplary embodiments, a phosphor may be disposed on a different element, rather than being disposed on the package in which the LED is positioned, to convert light. This embodiment is illustrated in FIGS. 20 to 22.

Figure 20:
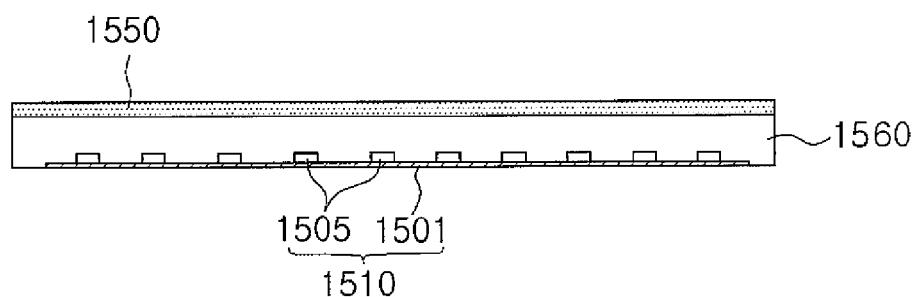
FIG. 20 is a sectional view of a direct type backlight unit according to an exemplary embodiment of the present invention.

First, as shown in FIG. 20, the direct type backlight unit 1500 according to the present exemplary embodiment may include a phosphor film 1550, and a LED light source module 1510 arranged on a lower surface of the phosphor film 1550.

The backlight unit 1500 illustrated in FIG. 20 may include a bottom case 1560 for accommodating the light source module 1510. In the present exemplary embodiment, the phosphor film 1550 is disposed on an upper surface of the bottom case 1560. At least a portion of light emitted from the light source module 1510 may be wavelength-converted by the phosphor film 1550. The phosphor film 1550 may be fabricated as a separate film and applied, or may be provided in the form of being integrally coupled with the light diffuser.

Here, the LED light source module 1510 may include a PCB 1501 and a plurality of LED light sources 1505 mounted on an upper surface of the substrate 1501.

Figure 21A:
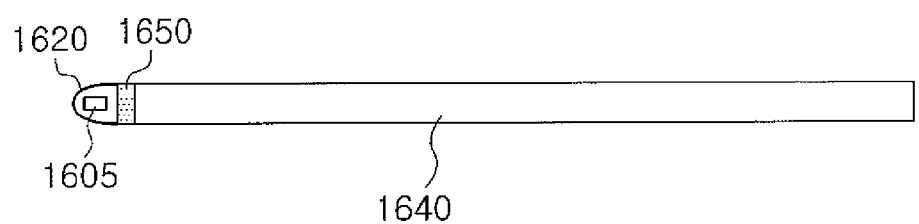
FIGS. 21A and 21B are sectional views of an edge type backlight unit according to another exemplary embodiment of the present invention.
Figure 21B:
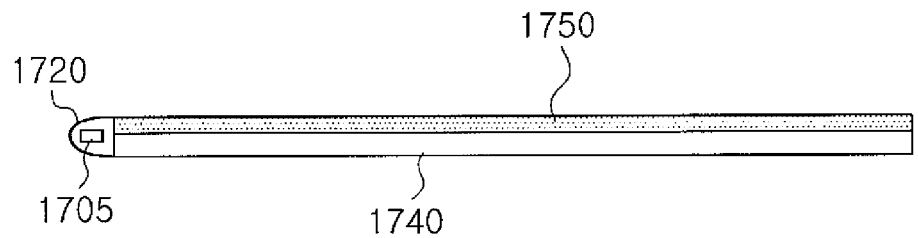
Figure 22:
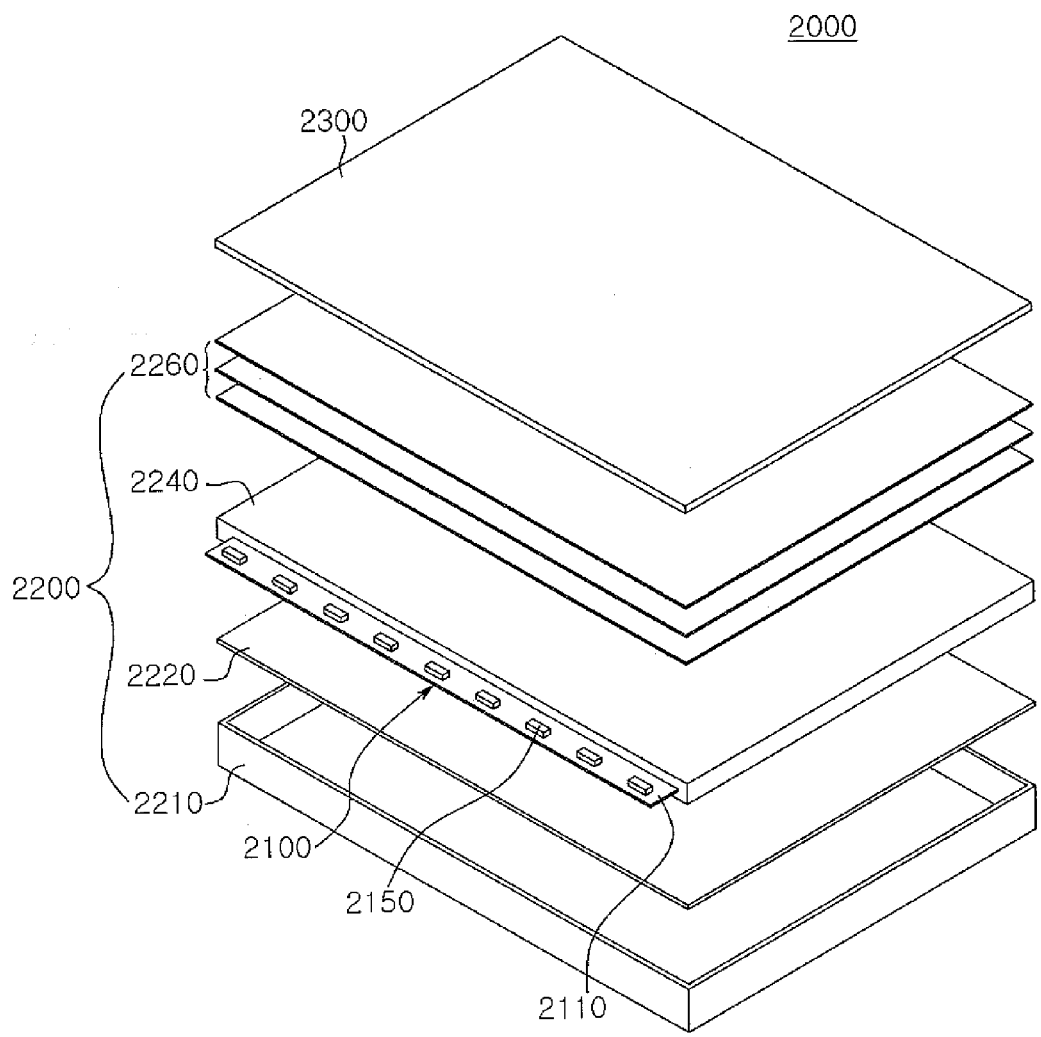
FIG. 22 is an exploded perspective view of a display apparatus according to an exemplary embodiment of the present invention.

FIGS. 21A and 21B are sectional views of an edge type backlight unit according to another exemplary embodiment of the present invention.

An edge type backlight unit 1600 illustrated in FIG. 21A may include a light guide plate 1640 and an LED light source 1605 provided at one side of the light guide plate 1640. Light emitted from the LED light source 1605 may be guided to the interior of the light guide plate 1640 by means of a reflection structure. In the present exemplary embodiment, a phosphor film 1650 may be positioned between the side of the light guide plate 1640 and the LED light source 1605.

An edge type backlight unit 1700 illustrated in FIG. 21B may include a light guide plate 1740, an LED light source 1705 provided to one side of the light guide plate 1740, and the reflection structure (not shown), similarly to the edge type backlight unit 1600 illustrated in FIG. 21a. In the present exemplary embodiment, a phosphor film 1750 is illustrated as being applied to a light emission surface of the light guide plate.

In this manner, the phosphor according to the present exemplary embodiment can be implemented such that it is applied to a different device such as the backlight unit, or the like, rather than being directly applied to the LED light source.

FIG. 22 is an exploded perspective view of a display apparatus according to an exemplary embodiment of the present invention.

A display apparatus 2000 illustrated in FIG. 22 includes a backlight unit 2200 and an image display panel 2300 such as a liquid crystal panel. The backlight unit 2200 includes a light guide plate 2240 and an LED light source module 2100 provided to at least one side of the light guide plate 2240.

In the present exemplary embodiment, the backlight unit 2200 may further include a bottom case 2210 and a reflective plate 2220 positioned at a lower side of the light guide plate 2240.

Also, various types of optical sheets 2260, such as a diffusion sheet, a prism sheet, or a protection sheet, may be disposed between the light guide plate 2240 and the liquid crystal panel 2300 according to demand for various optical characteristics.

The LED light source module 2100 may include a PCB 2110 provided to at least one side of the light guide plate 2240 and a plurality of LED light sources 2150 mounted on the PCB 2110 and emit light to the light guide plate 2240. The plurality of LED light sources 2150 may be the foregoing light emitting device package. The plurality of LED light sources employed in the present exemplary embodiment may be a side view type light emitting device package in which the sides of the plurality of LED light sources are mounted to be adjacent to the light emission surface.

As described above, the foregoing phosphors can be applicable to an LED light source module applied to various mounting structures and providing various types of white light. The foregoing light emitting device package or a light source module including the same may be applicable to various types of display apparatuses or lighting devices.

As set forth above, according to exemplary embodiments of the invention, complex crystal phosphors are implemented and advantages of the respective crystals are combined to provide a wavelength conversion material having excellent characteristics. Red light having a great half amplitude guaranteeing high color rendering can be provided by partially employing a β-sialon crystal, and an emission spectrum satisfying various characteristics can be provided according to rate. The effect of increasing a color rendering index can be expected compared with the related art white light emitting device.

Also, high color rendering can be guaranteed by introducing a novel complex crystal by partially substituting an oxygen element positioned with a nitrogen element along with the containing of aluminum, and high light emission characteristics, excellent thermal and chemical stability anticipated in a nitride-based phosphor can be obtained, and a white light emitting device with a high output/high reliability can be advantageously used with these merits.

While the present invention has been shown and described in connection with the exemplary embodiments, it will be apparent to those skilled in the art that modifications and variations can be made without departing from the spirit and scope of the invention as defined by the appended claims.

What is claimed is:

1. A complex crystal phosphor of an inorganic composition comprising an M element, an Al element, silicon, oxygen, and nitrogen,
wherein the inorganic composition has particles of at least a first crystal phase and a second crystal phase, so that a single particle comprises both the first crystal phase and the second crystal phase, and the first crystal phase includes a $M_2SiO_{4-y}N_y$ crystal, wherein $0<x<3$ and $y=2x/3$, and the second crystal phase includes a β-sialon crystal,
wherein M is at least one element selected from the group consisting of magnesium (Mg), calcium (Ca), strontium (Sr), and barium (Ba).

2. The phosphor of claim 1, wherein when an excitation source is irradiated, the complex crystal phosphor emits light having a peak wavelength ranging from about 570 nm to about 660 nm.

3. The phosphor of claim 2, wherein an emission wavelength spectrum of the complex crystal phosphor has a substantially single peak wavelength.

4. The phosphor of claim 2, wherein the excitation source has a peak wavelength ranging from about 300 nm to about 480 nm.

5. The phosphor of claim 3, wherein the half amplitude of the light emission wavelength spectrum is approximately 100 nm or greater.

6. The phosphor of claim 1, wherein the first crystal phase is $Sr_2SiO_{4-x}N_y$, wherein $0<x<3$, $y=2x/3$.

7. The phosphor of claim 1, wherein the second crystal phase is $Si_{6-z}Al_zO_zN_{8-z}$, wherein $0<z<1$.

8. The phosphor of claim 1, wherein the first crystal phase is contained at about 60 to about 95 mass percent, and the second crystal phase is contained at about 5 to about 40 mass percent.

9. The phosphor of claim 1, wherein the complex crystal phosphor comprises a quasi-orthorhombic crystal in which the two crystal phases are mutually employed.

10. The phosphor of claim 1, wherein the complex crystal phosphor further comprises a third crystal phase as a $M_2Si_5O_aN_{8-b}$ crystal, wherein $0<a<3$, $b=2a/3$.

11. The phosphor of claim 10, wherein the first crystal phase is contained at about 50 to about 90 mass percent, the second crystal phase is contained at about 5 to about 40 mass percent, and the third crystal phase is contained at about 10 mass percent or less.

12. The phosphor of claim 1, wherein the phosphor further comprises at least one type of rare earth element as an activator.

13. The phosphor of claim 12, wherein the rare earth element is selected from the group consisting of cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), and ytterbium (Yb).

* * * * *